United States Patent
Yamamoto et al.

(12)

(10) Patent No.: US 8,705,586 B2
(45) Date of Patent: Apr. 22, 2014

(54) SOLID-STATE LASER ELEMENT

(75) Inventors: Shuhei Yamamoto, Tokyo (JP);
Takayuki Yanagisawa, Tokyo (JP);
Yasuharu Koyata, Tokyo (JP);
Yoshihito Hirano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 261 days.

(21) Appl. No.: 12/675,125

(22) PCT Filed: Aug. 30, 2007

(86) PCT No.: PCT/JP2007/066936
§ 371 (c)(1),
(2), (4) Date: Feb. 25, 2010

(87) PCT Pub. No.: WO2009/028078
PCT Pub. Date: Mar. 5, 2009

(65) Prior Publication Data
US 2010/0303120 A1    Dec. 2, 2010

(51) Int. Cl.
*H01S 3/06* (2006.01)
(52) U.S. Cl.
USPC ......... 372/66; 372/39; 372/43.01; 372/49.01; 372/70; 372/71; 372/99
(58) Field of Classification Search
CPC ............................ H01S 3/0604; H01S 3/0615
USPC .............. 372/66, 39, 43.01, 49.01, 70, 71, 99
See application file for complete search history.

(56) References Cited

U.S. PATENT DOCUMENTS

| | | | |
|---|---|---|---|
| 6,219,361 B1* | 4/2001 | Guch et al. | ...... 372/10 |
| 2004/0240500 A1 | 12/2004 | Mercer | |
| 2006/0114961 A1 | 6/2006 | Manni | |

(Continued)

FOREIGN PATENT DOCUMENTS

| | | |
|---|---|---|
| JP | 6 268290 | 9/1994 |
| JP | 2001-36171 | 2/2001 |

(Continued)

OTHER PUBLICATIONS

U.S. Appl. No. 12/671,458, filed Jan. 29, 2010, Yanagisawa, et al.

(Continued)

*Primary Examiner* — Yuanda Zhang
(74) *Attorney, Agent, or Firm* — Oblon, Spivak, McClelland, Maier & Neustadt, L.L.P.

(57) ABSTRACT

To suppress the amplification of spontaneous emission light in a principal plane width direction to thereby suppress a gain in directions other than a beam axis direction and output a high-power laser, in a solid-state laser element of a plane waveguide type that causes a fundamental wave laser beam to oscillate in a beam axis direction in a laser medium of a flat shape and forms a waveguide structure in a thickness direction as a direction perpendicular to a principal plane of the flat shape in the laser medium, inclined sections 12 are provided on both sides of the laser medium, the inclined sections 12 inclining a predetermined angle to reflect spontaneous emission light in the laser medium to a principal plane side of the flat shape, the spontaneous emission light traveling in the beam axis direction and a principal plane width direction as a direction perpendicular to the thickness direction.

8 Claims, 11 Drawing Sheets

(56) References Cited

U.S. PATENT DOCUMENTS

| | | |
|---|---|---|
| 2006/0256829 A1 | 11/2006 | Koyata et al. |
| 2007/0110116 A1* | 5/2007 | Vetrovec et al. ............... 372/66 |
| 2008/0025362 A1 | 1/2008 | Yamamoto et al. |
| 2008/0095202 A1 | 4/2008 | Yanagisawa et al. |
| 2010/0086001 A1 | 4/2010 | Manni |
| 2011/0243166 A1 | 10/2011 | Manni |

FOREIGN PATENT DOCUMENTS

| | | |
|---|---|---|
| JP | 2002-528900 | 9/2002 |
| JP | 2004 296671 | 10/2004 |
| JP | 2004 536460 | 12/2004 |
| JP | 2006 196882 | 7/2006 |
| JP | 2007 110039 | 4/2007 |
| JP | 2007110039 A * | 4/2007 ............ H01S 3/094 |
| JP | 2008-522409 | 6/2008 |
| WO | 2006/001063 | 1/2006 |
| WO | 2006/086036 | 8/2006 |
| WO | 2006 103767 | 10/2006 |

OTHER PUBLICATIONS

U.S. Appl. No. 12/677,827, filed Mar. 12, 2010, Koyata, et al.
MacKenzie, Jacob I. "Multi-Watt, High Efficiency, Diffraction-Limited Nd:YAG Planar Waveguide Laser", IEE Journal of Quantum Electronics, vol. 39, No. 3, pp. 493-500, Mar. 2003.
Decision of a Patent Grant issued Jan. 22, 2013 in Japanese Patent Application No. 2009-529927 (with English translation).
Office Action issued Oct. 30, 2012 in Japanese Patent Application No. 2009-529927, with English translation.

* cited by examiner

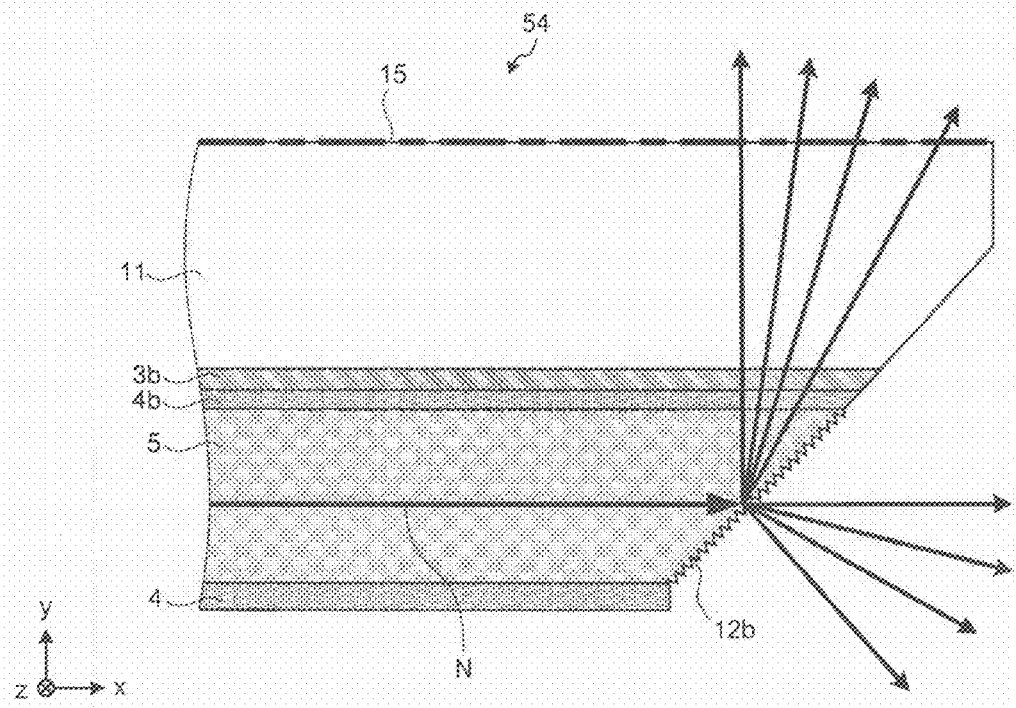
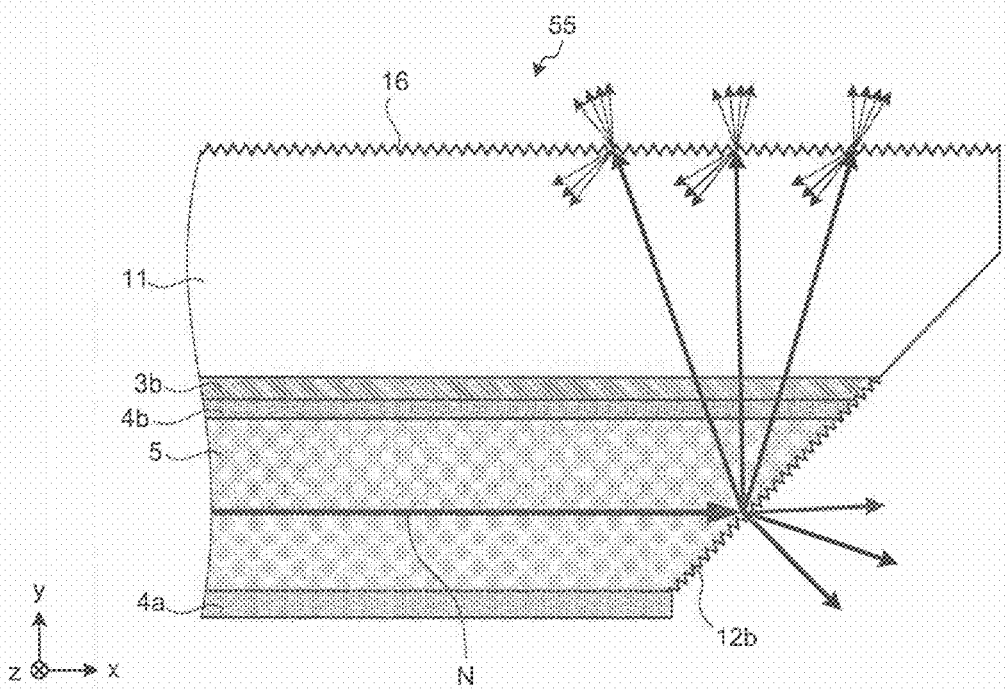

SOLID-STATE LASER ELEMENT

TECHNICAL FIELD

The present invention relates to a solid-state laser element that causes a laser beam to oscillate in a plane waveguide of a flat shape and outputs a laser.

BACKGROUND ART

In apparatuses that display color images such as a printer and a projection television, light sources for three colors R (red), G (green), and B (blue) are required as light sources. In recent years, as these light sources, a wavelength conversion laser device (a laser oscillator) that converts, with a laser beam in a 900 nm band, a 1 µm band, or 1.3 µm band set as a fundamental wave laser beam, the fundamental wave laser beam into a second harmonic using a nonlinear material (SHG, Second Harmonic Generation) is developed. To realize high conversion efficiency from the fundamental wave laser beam into a second harmonic laser beam in the SHG, it is requested to increase the power density of the fundamental wave laser beam on the nonlinear material and to convert the fundamental wave laser beam into a high-luminance laser beam with less wavefront aberration.

A two-dimensional waveguide laser can realize the high conversion efficiency from the fundamental wave laser beam into the second harmonic laser beam because the two-dimensional waveguide laser can increase the power density of the fundamental wave laser beam. However, an increase in power is restricted because the two-dimensional waveguide laser has a breakage limit due to the high power density. Further, the increase in power is restricted because the power of LD (Laser Diode) beams having a high beam quality in a two-dimensional direction (in the same plane as the two-dimensional waveguide) connectable to the two-dimensional waveguide is generally low.

Therefore, a plane waveguide laser having a one-dimensional waveguide may be used to increase the power of the second harmonic laser beam. In this plane waveguide laser, the increase in power is realized by causing a laser beam to oscillate in a direction perpendicular to a laser beam axis in a flat surface (a direction perpendicular to principal planes of a flat plate) according to a space mode, increasing a beam diameter of the laser beam in the direction perpendicular to the laser beam axis, and changing the laser beam to multiple beams. In such a plane waveguide laser having the one-dimensional waveguide, LD beams as excitation sources only have to be coupled in a one-dimensional direction in the plane waveguide. Therefore, a high-power broad area LD can be used for the plane waveguide laser having the one-dimensional waveguide. As a result, a high-power laser beam can be obtained. Further, a multi-emitter LD in which light emitting points of LD beams are arranged in the one-dimensional direction can be used for the plane waveguide laser having the one-dimensional waveguide. Therefore, laser power larger than that obtained by using the broad area LD can be obtained (see Non-Patent Document 1).

Non-Patent Document 1: IEEE. J. Quantum Electronics Vol. 39 (2003), 495

DISCLOSURE OF INVENTION

Problem to be Solved by the Invention

However, in the conventional plane waveguide laser, when the beam diameter of the laser beam is increased in the direction perpendicular to the laser beam axis (the thickness direction of the flat surface) or when the laser beam is changed to multiple beams, the size in the width direction of the flat surface has to be increased. When the size in the width direction of the flat surface is wide, because a gain in the width direction of the flat surface increases, there is a problem in that parasitic oscillation occurs and high-power laser output cannot be obtained in some case.

Even when the parasitic oscillation does not occur, there is a problem in that a gain in the laser beam axis direction decreases because of extraction of energy due to the amplification of spontaneous emission light and high-power laser output cannot be obtained.

The present invention has been devised in view of the above and it is an object of the present invention to obtain a solid-state laser element that can output a high-power laser.

Means for Solving Problem

In order to solve the above mentioned problem and achieve the object, a solid-state laser element of a plane waveguide type according to the present invention that causes a fundamental wave laser beam to oscillate in a beam axis direction in a laser medium of a flat shape and forms a waveguide structure in a thickness direction as a direction perpendicular to a principal plane of the flat shape in the laser medium, the solid-state laser element includes inclined sections that are provided on both sides of the laser medium and inclined a predetermined angle to reflect spontaneous emission light in the laser medium to a principal plane side of the flat shape, the spontaneous emission light traveling in the beam axis direction and a principal plane width direction as a direction perpendicular to the thickness direction.

Effect of the Invention

The solid-state laser element according to the present invention inclines the inclined sections the predetermined angle to reflect the spontaneous emission light to the principal plane side of the flat shape. Therefore, there is an effect that it is possible to suppress the amplification of the spontaneous emission light in the principal plane width direction and it is possible to suppress a gain in directions other than the beam axis direction and output a high-power laser.

BRIEF DESCRIPTION OF DRAWINGS

FIG. 7 is an enlarged view (4) of the A section shown in FIG. 3.

FIG. 8 is an enlarged view (5) of the A section shown in FIG. 3.

EXPLANATIONS OF LETTERS OR NUMERALS

| | |
|---|---|
| 1 | semiconductor laser |
| 1a | active layer |
| 2 | heat sink |
| 3, 3b | bonding agents |
| 4, 4b | clads |
| 5 | laser media |
| 5a, 5b, 7a, 7b | end faces |
| 6 | optical axis |
| 7 | nonlinear material |
| 11 | substrate |
| 12 | inclined section |
| 12a | mirror-finished inclined section |
| 12b | roughed inclined section |
| 13, 14 | wing sections |
| 13a, 16, 20, 20a to 20e | roughened surfaces |
| 13b, 15 | reflection preventing films |
| 13b, 13d | absorbents |
| 50 to 55, 60 to 64, 70 to 75, 80 | solid-state laser elements |
| 101 to 104 | wavelength conversion laser devices |
| L | second harmonic laser beam |
| N | spontaneous emission light |

BEST MODE(S) FOR CARRYING OUT THE INVENTION

Solid-state laser elements according to embodiments of the present invention are explained in detail below with reference to the drawings. The present invention is not limited by the embodiments.

First Embodiment

Figure 1:
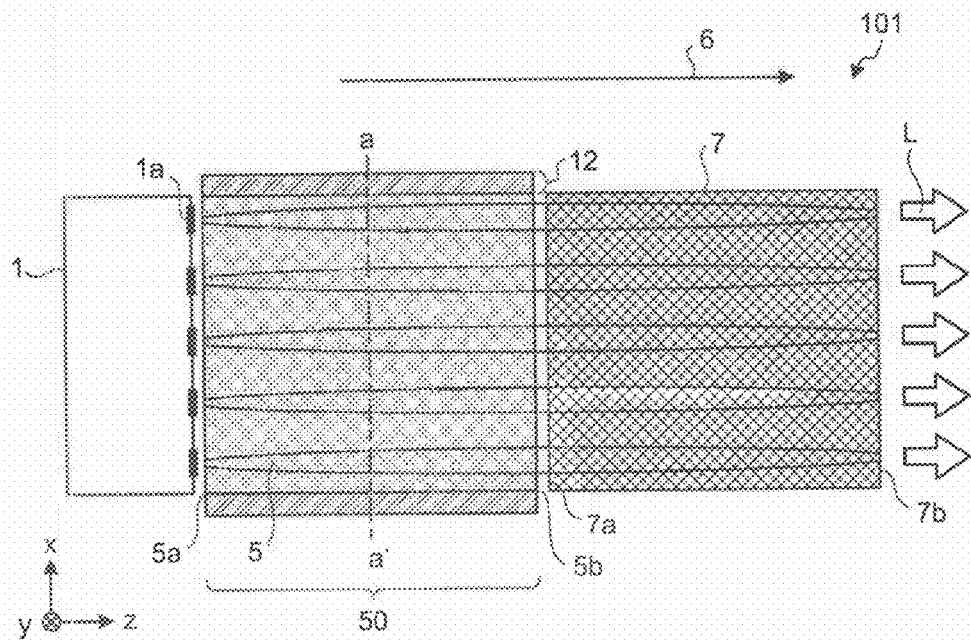
FIG. 1 is a top view of the configuration of a wavelength conversion laser device according to a first embodiment.
Figure 2:
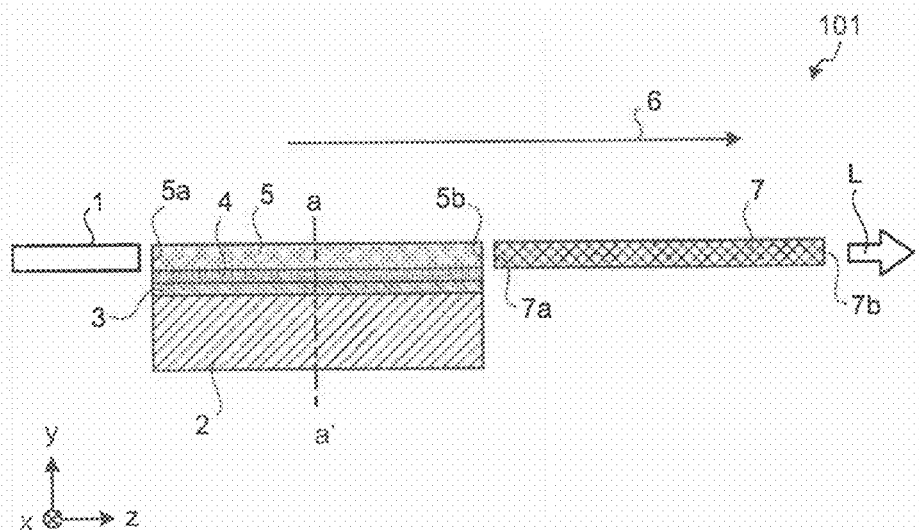
FIG. 2 is a sectional view of the wavelength conversion laser device according to the first embodiment viewed from a side.

FIG. 1 is a top view of the configuration of a wavelength conversion laser device according to a first embodiment of the present invention. FIG. 2 is a sectional view of the wavelength conversion laser device according to the first embodiment of the present invention viewed from a side. In FIGS. 1 and 2, a beam axis representing a laser oscillation direction is indicated by an optical axis 6.

A wavelength conversion laser device 101 of a plane waveguide type is a laser oscillator in which inclined sections 12 are formed on sides (end faces parallel to the optical axis 6) of a laser medium 5 to suppress parasitic oscillation and energy extraction due to the amplification of spontaneous emission light in directions other than a laser beam axis direction (the optical axis 6). The wavelength conversion laser device 101 is used in light sources for a laser display device and an optical memory device in, for example, the optical information processing field. The wavelength conversion laser device 101 includes a semiconductor laser 1, a nonlinear material (a nonlinear optical material) 7, and a solid-state laser element 50 as a main characteristic of the present invention.

The semiconductor laser 1 outputs a plurality of LD beams from a plurality of active layers 1a. The semiconductor laser 1 emits an LD beam in an array shape to output a plurality of LD beams and causes the solid-state laser element 50 to perform multi-emitter oscillation. The solid-state laser element 50 is a plane waveguide element that causes a fundamental wave laser beam to oscillate. The solid-state laser element 50 includes a heat sink 2, a bonding agent 3, a clad (a low refractive index section) 4, and the laser medium 5. The nonlinear material (a wavelength conversion element) 7 is an element that converts the oscillating fundamental wave laser beam into a second harmonic laser beam L and emits a part of the converted second harmonic laser beam L. The nonlinear material 7 has a waveguide structure of a slab type.

In the following explanation, for convenience of the explanation, the optical axis 6 is assumed as a z-axis direction, a direction perpendicular to principal planes of the wavelength conversion laser device 101 is assumed as a y-axis direction (a thickness direction), and a direction perpendicular to both the z axis and the y axis is assumed as an x-axis direction (in the laser medium 5, a principal plane width direction).

The semiconductor laser 1, the laser medium 5, and the nonlinear material 7 respectively are formed in substantially rectangular flat shapes and disposed in the same plane such that principal planes of the respective flat shapes are parallel to the xz plane. The laser medium 5 is disposed between the semiconductor laser 1 and the nonlinear material 7 to be close to the semiconductor laser 1 on one side (an end face 5a perpendicular to the z axis) of the laser medium 5 and close to the nonlinear material 7 on a side opposed to this side (an end face 5b perpendicular to the z axis).

The nonlinear material 7 has an end face 7a and an end face 7b perpendicular to the optical axis 6. The end face 7a is arranged close to the end face 5b of the laser medium 5. The end face 7b of the nonlinear material 7 is an end face on a side where the second harmonic laser beam L is emitted.

As explained above, in the wavelength conversion laser device 101, the semiconductor laser 1, the solid-state laser element 50, and the nonlinear material 7 are disposed such that the emission surface of the LD beams of the semiconductor laser 1, the end faces 5a and 5b of the laser medium 5, and the end faces 7a and 7b of the nonlinear material 7 are parallel to one another.

The laser medium 5 (the solid-state laser element 50) according to this embodiment has the inclined sections 12 on sides perpendicular to the end faces 5a and 5b (sides other than the end faces 5a and 5b of the flat shape) (both sides of the laser medium 5), respectively. The inclined sections 12 have a predetermined angle with respect to a direction perpendicular to the principal planes (the upper surface and the lower surface) of the laser medium 5 and extend in the optical axis 6 direction. The inclined sections 12 reflect spontaneous emission light, which propagates through the laser medium 5 at an angle including a component in the x-axis direction, to the upper surface side of the laser medium 5.

The width in the x-axis direction of the semiconductor laser 1 is substantially equal to the width in the x-axis direction on the lower surface side of the laser medium 5. The semiconductor laser 1 substantially uniformly outputs excitation beams in the x-axis direction. The semiconductor laser 1 is, for example, a multi-emitter semiconductor laser in which a plurality of active layers 1a that output LD beams are arranged. When the semiconductor laser 1 is the multi-emitter semiconductor laser, in the semiconductor laser 1, the active layers 1a are arranged such that the active layers 1a line up in the x-axis direction on a side close to the end face 5a. In this case, because the semiconductor laser 1 outputs a plurality of LD beams from the active layers 1a, respective laser output beams are obtained from the active layers 1a arranged in the x-axis direction. The LD beams output from the semiconductor laser 1 are made incident from the end face 5a in an xz plane direction of the laser medium 5 (a direction perpendicular to the xy plane) (the optical axis 6 direction) and absorbed by the laser medium 5. A heat sink for cooling (not shown in the figure) can be bonded to the semiconductor laser 1 according to necessity.

The end face 5a of the laser medium 5 is a total reflection film that reflects the fundamental wave laser beam. The end face 5b of the laser medium 5 is a reflection preventing film that transmits the fundamental wave laser beam. The end face 7a of the nonlinear material 7 is an optical film (a partial reflective film) that transmits the fundamental wave laser beam and reflects the second harmonic laser beam L. The end face 7b of the nonlinear material 7 is an optical film (a partial reflective film) that reflects the fundamental wave laser beam and transmits the second harmonic laser beam L. The total reflection film, the reflection preventing film, and the optical film are manufactured by, for example, laminating dielectric thin films. When the excitation beams output from the semiconductor laser 1 are made incident from the end face 5a of the laser medium 5, the total reflection film of the end face 5a is an optical film that transmits the excitation beams and reflects the fundamental wave laser beam.

The laser medium 5 has, for example, the thickness of several to several tens micrometers in the y-axis direction and the width (the principal plane width of the upper surface and the principal panel width of the lower surface) of several hundreds micrometers to several millimeters in the x-axis direction. As the laser medium 5, a general solid-state laser material can be used. The laser medium 5 is, for example, Nd:YAG, Nd:YLF, Nd:Glass, Nd:YVO4, Nd:GdVO4, Yb:YAG, Yb:YLF, Yb:KGW, Yb:KYW, Er:Glass, Er:YAG, Tm:YAG, Tm:YLF, Ho:YAG, Ho:YLF, Tm,Ho:YAG, Tm,Ho:YLF, Ti:Sapphire, or Cr:LiSAF.

A clad 4 has a refractive index smaller than that of the laser medium 5 and is bonded to the lower surface side of the laser medium 5 on one plane parallel to the xz plane of the laser medium 5 (the upper surface of the clad 4). The clad 4 is manufactured by, for example, a method of vapor-depositing a film containing an optical material as a row material on the laser medium 5 or a method of optically bonding the optical material to the laser medium 5 with optical contact, diffusion bonding, or the like.

The heat sink 2 contains a material having large thermal conductivity and is bonded to the clad 4 via the bonding agent 3 on the lower surface side of the clad 4. The bonding agent 3 discharges heat generated in the laser medium 5 to the heat sink 2 via the clad 4. As this bonding agent 3, for example, metal solder, an optical adhesive, or a thermal conduction adhesive is used. In the clad 4, a surface (the bottom surface) opposed to the surface to which the laser medium 5 is bonded can be metalized (a metal film can be deposited on the surface) to increase the strength of the bonding with the bonding agent 3. When the heat sink 2 is formed of an optical material, the clad 4 and the heat sink 2 can be directly bonded by, for example, optical contact, diffusion bonding, or the like. Consequently, the heat sink 2, the bonding agent 3, the clad 4, and the laser medium 5 form a laminated structure in the y-axis direction.

As the nonlinear material 7, a general wavelength converting material can be used. As the nonlinear material 7, for example, KTP, KN, BBO, LBO, CLBO, LiNbO3, or LiTaO3 is used. If MgO added LiNbO3, MgO added LiTaO3, stoichiometric LiNbO3, or stoichiometric LiTaO3 robust against optical damage is used as the nonlinear material 7, highly efficient wavelength conversion is possible because the power density of an incident fundamental wave laser beam can be increased. Further, if MgO added LiNbO3, MgO added LiTaO3, stoichiometric LiNbO3, stoichiometric LiTaO3, or KTP having a periodic reversal polarization structure is used as the nonlinear material 7, more highly accurate wavelength conversion than that realized by MgO added LiNbO3 and the like is possible because a nonlinear constant is large.

Figure 3:
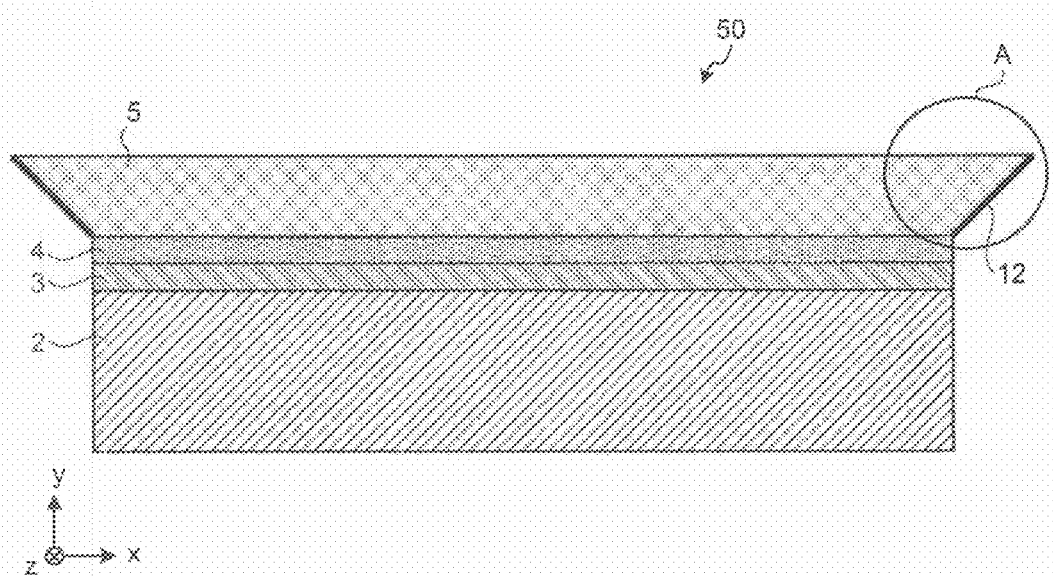
FIG. 3 is an a-a' sectional view of FIGS. 1 and 2.

FIG. 3 is an a-a' sectional view of FIGS. 1 and 2. As shown in FIG. 3, the laser medium 5 forming the waveguide structure is extended in the principal plane width direction of the laser medium 5. The inclined sections 12 are formed at ends (inclined surfaces) of the extended laser medium 5.

In the laser medium 5, the principal plane width on the upper surface side is larger than the principal plane width on the lower surface side. The a-a' section of the laser medium 5 is formed in a trapezoidal shape. In other words, the principal plane width of the upper surface of the laser medium 5 is formed to be larger than the principal plane width of the lower surface of the laser medium 5 and the width in the x-axis direction of the principal planes of the heat sink 2, the bonding agent 3, and the clad 4. The inclined sections 12 are inclined from a direction perpendicular to the principal planes of the laser medium 5 such that the principal plane width gradually increases from the lower surface side to the upper surface side of the laser medium 5. Therefore, the inclined sections 12 form a predetermined angle other than 90 degrees with the upper surface and the lower surface of the laser medium 5 (e.g., 30 degrees with the upper surface). Consequently, the laser medium 5 is formed as a trapezoidal pole with the end faces 5a and 5b forming a trapezoid and a column axis being parallel to the optical axis 6.

In the explanation with reference to FIG. 3, the principal plane width on the upper surface side of the laser medium 5 is larger than the principal plane width on the lower surface side thereof. However, the principal plane width on the lower surface side of the laser medium 5 can be set larger than the principal plane width on the upper surface side thereof. In this case, the principal plane width on the upper surface side of the laser medium 5 is set larger than the principal plane width of the clad 4. The inclined sections 12 are not limited to straight lines and can be curved lines.

An operation procedure of the wavelength conversion laser device 101 is explained. An excitation beam from the semiconductor laser 1 made incident on the end face 5a of the laser medium 5 is absorbed by the laser medium 5 and generates a gain with respect to the fundamental wave laser beam in the inside of the laser medium 5. The fundamental wave laser beam oscillates, with the gain generated in the laser medium 5, between the end face 5a of the laser medium 5 and the end face 7a of the nonlinear material 7 perpendicular to the optical axis 6.

A crystallographic axis angle, temperature, a period of periodic reversal polarization, and the like of the nonlinear material 7 are optimized such that the fundamental wave laser beam is converted into the second harmonic laser beam L by a nonlinear effect. Therefore, when the fundamental wave laser beam oscillating between the end face 5a and the end face 7b is made incident on the nonlinear material 7, a part of the fundamental wave laser beam is converted into the second harmonic laser beam L and output to the outside from the end face 7b.

The fundamental wave laser beam remaining in the nonlinear material 7 without being converted into the second harmonic laser beam L is totally reflected on the end face 7b, passes through the nonlinear material 7 again, and is converted into the second harmonic laser beam L. The second harmonic laser beam L generated by converting a part of the remaining fundamental wave laser beam is totally reflected on the end face 7a and output to the outside from the end face 7b.

The laser medium 5 has the thickness in the y-axis direction about several times to several tens times as large as the wavelength of a laser beam. Because the laser medium 5 is sandwiched by the clad 4 and the air having refractive indexes smaller than that of the laser medium 5, the laser medium 5 operates as a waveguide with the fundamental wave laser beam contained in the laser medium 5 having the high refractive index. Consequently, the laser medium 5 forms a waveguide structure in the y-axis direction. The fundamental wave laser beam in the laser medium 5 selectively oscillates in a predetermined mode (a laser oscillation mode) of the waveguide. The mode of the waveguide can be arbitrarily set by adjusting the refractive index of the clad 4 and the thickness in the y-axis direction of the laser medium 5. Therefore, in the mode of the waveguide, high luminance oscillation can be realized by guiding only a low-order mode or a single mode.

In the laser medium 5, a refractive index distribution also occurs in the y-axis direction because of a heat distribution caused by exhaust heat. However, if a refractive index difference between the clad 4 and the laser medium 5 and a refractive index difference between the air and the laser medium 5 are sufficiently large compared with a refractive index change due to the heat distribution, the mode of the waveguide is predominant and the influence due to the heat in the y-axis direction can be neglected. In this embodiment, the clad 4 and the laser medium 5 in which the refractive index difference between the clad 4 and the laser medium 5 and the refractive index difference between the air and the laser medium 5 are values sufficiently larger than the refractive index change due to the heat distribution are used in the wavelength conversion laser device 101.

In the nonlinear material 7, the upper surface and the lower surface perpendicular to the y axis are sandwiched by the air and a clad (not shown in the figure). The air and the clad have refractive indexes that are small compared with that of the nonlinear material 7. The nonlinear material 7 operates as a waveguide in the y-axis direction in the same manner as the laser medium 5 because the thickness thereof in the y-axis direction is about several times to several tens times as large as the wavelength of the laser beam. Consequently, the laser medium 5 and the nonlinear material 7 set the laser beam in the oscillation mode.

When the nonlinear material 7 absorbs the laser beam and generates heat, the heat absorbed in the nonlinear material 7 can be discharged to the outside of nonlinear material 7 by bonding a heat sink to the lower surface of the nonlinear material 7 or the clad (not shown in the figure) bonded to the nonlinear material 7.

For example, when the heat sink is directly bonded to the nonlinear material 7, the y-axis direction of the nonlinear material 7 is allowed to be used as a waveguide by using an optical material having a refractive index smaller than that of the nonlinear material 7 as a heat sink material or using a bonding agent (e.g., an optical adhesive) having a refractive index smaller than that of the nonlinear material 7. In other words, the nonlinear material 7 and the solid-state laser element 50 are caused to form a waveguide structure in the vertical direction (the y-axis direction).

A mode in the y-axis direction of laser oscillation in the z-axis direction in the laser oscillator (from the end face 5a of the laser medium 5 to the end face 7b of the nonlinear material 7) is selectively set according to a mode of the waveguide of the laser medium 5 and a mode of the waveguide of the nonlinear material 7. Each of the mode of the waveguide of the laser medium 5 and the mode of the waveguide of the nonlinear material 7 can be arbitrarily set according to the thickness in the y-axis direction of the laser medium 5 and a refractive index difference between the laser medium 5 and the clad 4. Therefore, in the mode of the waveguide of the laser medium 5 and the mode of the waveguide of the nonlinear material 7, high luminance oscillation can be realized by guiding only a low-order mode or a single mode.

The waveguide mode of the laser medium 5 and the waveguide mode of the nonlinear material 7 can be the same waveguide mode or can be different waveguide modes. For example, if one waveguide mode is set as a multimode and the other waveguide mode is set as a single mode, because a mode of laser oscillation is restricted by a lowest order mode, a laser can selectively oscillate in the single mode.

A mode in the x-axis direction of laser oscillation in the z-axis direction in the laser oscillator is set in a spatial mode without being selected according to a waveguide because the principal plane width of the laser medium 5 and the width in the x-axis direction of the nonlinear material 7 are sufficiently large compared with the wavelengths of the fundamental wave laser beam and the second harmonic laser beam L.

Spontaneous emission light of the laser medium 5 is explained. The laser medium 5 excited by a LD beam emits spontaneous emission light in all directions and resonates in the optical axis 6 direction to perform laser oscillation. Therefore, if there is unintended parasitic oscillation in directions other than the optical axis 6 direction or extraction of energy due to the amplification of the spontaneous emission light, a gain in the optical axis 6 direction decreases and laser output power falls.

For example, in spontaneous emission light propagating through the laser medium 5 at an angle including a component in the x-axis direction, components that satisfy all reflection angles on all sides in the laser medium 5 and all boundary surfaces (the upper surface and the lower surface) of the laser medium 5 may be amplified propagating through the waveguide at the angle including the component in the x-axis direction. When the components that satisfy all the reflection angles increase, a gain received by spontaneous emission light propagating in a direction including the component in the x-axis direction increases. Therefore, parasitic oscillation that is totally reflected in the inside of the laser medium 5 tends to occur. In particular, when a semiconductor laser having large width in the x-axis direction or a semiconductor laser in which a plurality of active layers 1a are arranged is used as an excitation source, parasitic oscillation that is totally reflected in the inside of the laser medium 5 tends to occur.

Even when a parasitic oscillation threshold value is not reached, a gain in the optical axis 6 direction decreases because of extraction of energy due to the amplification of the spontaneous emission light propagating in the direction including the x-axis direction in the laser medium 5 and high-power laser output cannot be obtained.

In this way, the spontaneous emission light generated in the laser medium 5 is amplified by repeating total reflection on the sides and the like of the laser medium 5. On the sides of the laser medium 5, when the sides of the laser medium 5 are perpendicular to the principal planes of the laser medium 5, the spontaneous emission light tends to satisfy all reflection angles on the sides of the laser medium. Therefore, the extraction of energy due to the amplification of the spontaneous emission light can be suppressed by inclining the sides of the laser medium 5 by a predetermined angle from the direction perpendicular to the principal planes of the laser medium 5.

In this embodiment, the inclined sections 12 are formed on the sides of the laser medium 5. Therefore, a reflection angle of the spontaneous emission light reflected on the inclined sections 12 increases. Consequently, because the spontaneous emission light deviates from the total reflection condition for the waveguide and leaks to the outside of the waveguide, the amplification of the spontaneous emission light in the x-axis direction decreases. Therefore, even when the semiconductor laser 1 having large width in the x-axis direction or the semiconductor laser 1 in which a plurality of active layers 1a are arranged is used as an excitation source, the parasitic oscillation and the extraction of energy due to the amplification of the spontaneous emission light decrease and the decrease in the gain in the optical axis 6 direction is reduced. Consequently, the wavelength conversion laser device 101 can generate a high-power laser beam in the optical axis 6 direction.

Figure 4:
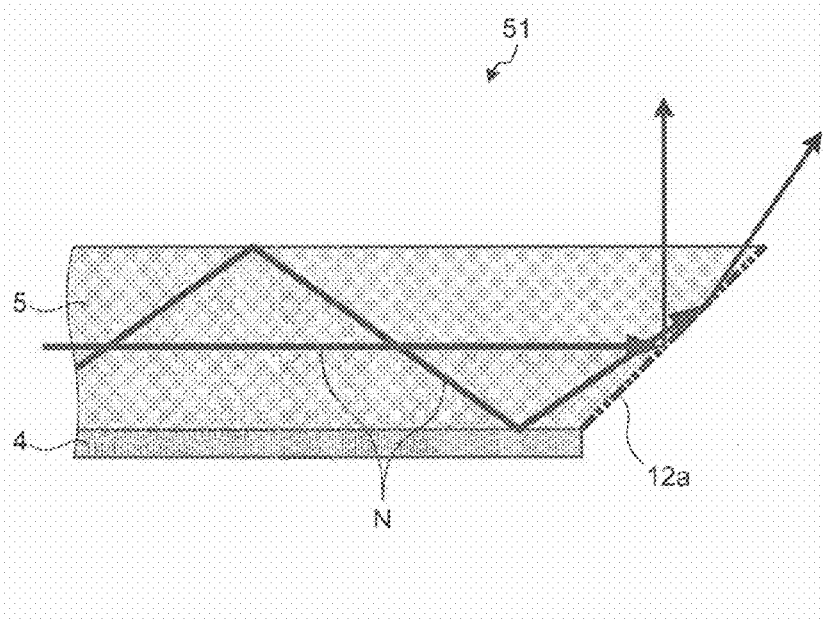
FIG. 4 is an enlarged view (1) of an A section shown in FIG. 3.
Figure 5:
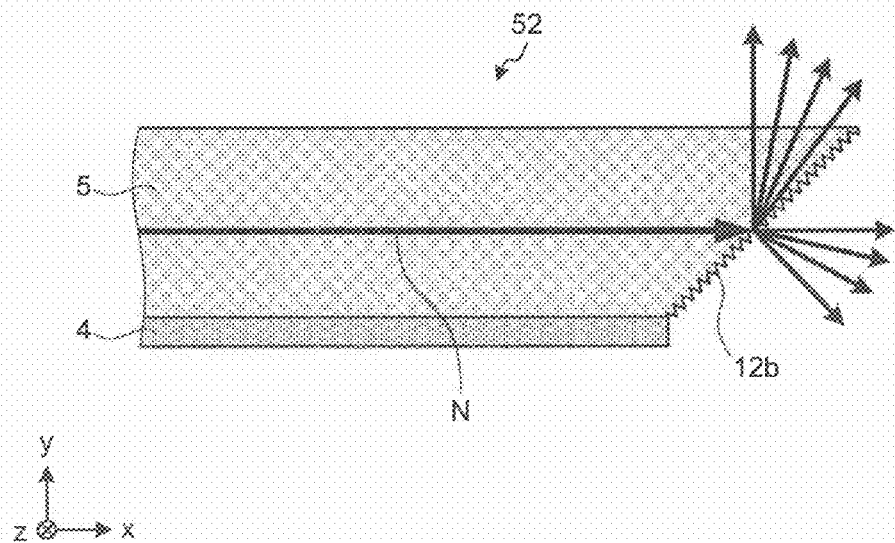
FIG. 5 is an enlarged view (2) of the A section shown in FIG. 3.

FIG. 4 is an enlarged view (1) of an A section shown in FIG. 3. FIG. 5 is an enlarged view (2) of the A section shown in FIG. 3. In FIG. 4, the A section shown in FIG. 3 is shown as a solid-state laser element 51. In FIG. 5, the A section shown in FIG. 3 is shown as a solid-state laser element 52.

In the solid-state laser element 51 shown in FIG. 4, the section of the inclined section 12 is formed as a mirror-finished inclined section 12a that mirror-reflects spontaneous emission light N. In this case, the spontaneous emission light N propagating in the laser medium 5 at the angle including the component in the x-axis direction (hereinafter referred to as spontaneous emission light N in the x-axis direction) is reflected on the mirror-finished inclined section 12a and travels to the upper surface side of the laser medium 5. Consequently, parasitic oscillation and the spontaneous emission light N to be amplified decrease.

In the solid-state laser element 52 shown in FIG. 5, the inclined section 12 is formed as a roughened inclined section 12b that transmits a part of the spontaneous emission light N while diffusing the same and reflects a part of the spontaneous emission light N while diffusing the same. In this case, a part of the spontaneous emission light N in the x-axis direction is reflected on the roughened inclined section 12b while being diffused and travels to the upper surface side of the laser medium 5. Further, a part of the spontaneous emission light N in the x-axis direction is transmitted through the roughened inclined section 12b while being diffused and travel to the outer side of the laser medium 5. The part of the spontaneous emission light N diffused by the roughened inclined section 12b deviates from the total reflection condition for the waveguide. Therefore, parasitic oscillation and the spontaneous emission light N to be amplified decrease.

In the explanation with reference to FIGS. 4 and 5, the solid-state laser elements 51 and 52 do not include a substrate and the like on the upper surface side of the laser medium 5. However, the solid-state laser elements 51 and 52 can include a substrate and the like.

Figure 6:
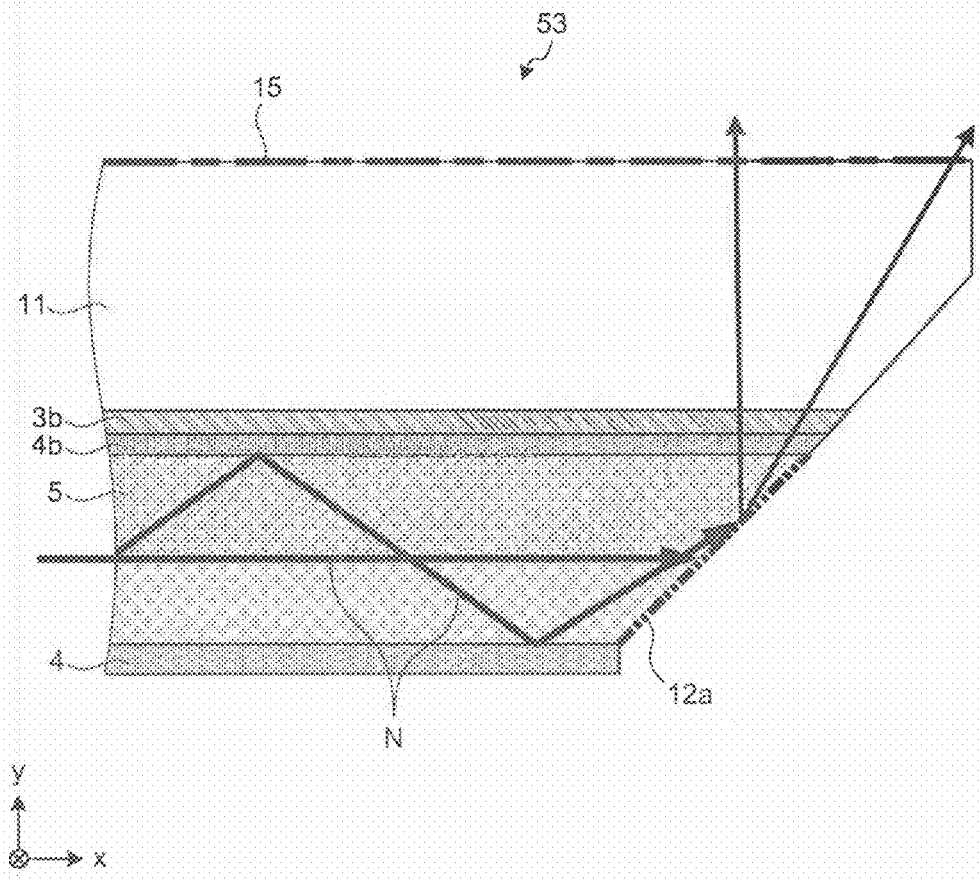
FIG. 6 is an enlarged view (3) of the A section shown in FIG. 3.

FIGS. 6 to 8 are enlarged views (3) to (5) of the A section shown in FIG. 3. In FIG. 6, the A section shown in FIG. 3 is shown as a solid-state laser element 53. In FIG. 7, the A section shown in FIG. 3 is shown as a solid-state laser element 54. In FIG. 8, the A section shown in FIG. 3 is shown as a solid-laser element 55. In the solid-state laser elements 53 to 55 shown in FIGS. 6 to 8, a clad 4b is disposed on the upper surface side of the laser medium 5 (a reflecting direction side of spontaneous emission light by the inclined section 12) and the clad 4b and a substrate 11 are bonded via a bonding agent 3b. Consequently, in the solid-state laser elements 53 to 55 shown in FIGS. 6 to 8, the substrate 11 is bonded to the laser medium 5 via a predetermined bonding surface.

The solid-state laser element 53 shown in FIG. 6 has a configuration in which the substrate 11 and the like are disposed on the upper surface side of the laser medium 5 (the laser medium 5 having the mirror-finished inclined section 12a) shown in FIG. 4. A reflection preventing film 15 is disposed on the upper surface (an opposed surface opposed to the bonding surface with the laser medium 5) of the substrate 11.

In the solid-state laser element 53, the spontaneous emission light N in the x-axis direction is reflected on the mirror-finished inclined section 12a and travels to the reflection preventing film 15. The spontaneous emission light N traveling to the reflection preventing film 15 is transmitted through the reflection preventing film 15 and exits to the outside of the solid-state laser element 53. Consequently, parasitic oscillation and the spontaneous emission light N to be amplified decrease.

The solid-state laser element 54 shown in FIG. 7 has a configuration in which the substrate 11 and the like are disposed on the upper surface side of the laser medium 5 (the laser medium 5 having the roughened inclined section 12b) shown in FIG. 5. The reflection preventing film 15 is disposed on the upper surface of the substrate 11.

In the solid-state laser element 54, a part of the spontaneous emission light N in the x-axis direction is reflected on the roughened inclined section 12b while being diffused and travels to the reflection preventing film 15. The spontaneous emission light N traveling to the reflection preventing film 15 is transmitted through the reflection preventing film 15 and exits to the outside of the solid-state laser element 54. Consequently, parasitic oscillation and the spontaneous emission light N to be amplified decrease.

The solid-state laser element 55 shown in FIG. 8 has a configuration in which the substrate 11 and the like are disposed on the upper surface side of the laser medium 5 shown in FIG. 5. The upper surface of the substrate 11 is formed as a roughened surface 16. In the solid-state laser element 55, a part of the spontaneous emission light N in the x-axis direction is reflected on the roughened inclined section 12b while being diffused and travels to the roughened surface 16. The roughened surface 16 transmits a part of the spontaneous emission light N while diffusing the same and reflects a part of the spontaneous emission light N while diffusing the same. The spontaneous emission light N transmitted through the roughened surface 16 exits to the outside of the solid-state laser element 55. Consequently, parasitic oscillation and the spontaneous emission light N to be amplified decrease.

The roughened surface 16 can be applied to the solid-state laser element 51 shown in FIG. 4. In FIGS. 6 to 8, a part (a triangular pole) on the lower surface side of the substrate 11 is shaved off and a cut surface of the substrate 11 exposed as a result of the shaving-off and a slope of the inclined section 12 line up on the same plane. However, the part on the lower surface side of the substrate 11 does not have to be shaved off. The ends in the x-axis direction of the clad 4b and the bonding agent 3b can be shaved off to be parallel to the slope of the inclined section 12 or do not have to be shaved off.

In the explanation with reference to FIGS. 6 to 8, the reflection preventing film 15 and the roughened surface 16 are disposed on the upper surface of the substrate 11. However, the reflection preventing film 15 and the roughened surface 16 can be disposed on the sides, the bottom surface, or the cut surface of the substrate 11.

An inclination angle (a side angle range) of the inclined section 12 with respect to the principal planes of the laser medium 5 is explained. A condition under which the spontaneous emission light N parallel to the principal planes of the laser medium 5 (components propagating through a core in parallel to the flat surface of the waveguide) is transmitted through the inclined section 12 without being totally reflected by the inclined section 12 is indicated by Formula (1).

$$\theta_3 < \operatorname{Sin}^1 \frac{1}{n_2} \quad (1)$$

$\theta_3$ represents an inclination angle of the inclined section 12 with respect to the direction perpendicular to the principal planes of the laser medium 5 and $n_2$ represents a refractive index of the laser medium 5. For example, when $n_2$=2.2, in a range in which the inclination angle $\theta_3$ satisfies $\theta_3$<27°, the spontaneous emission light N parallel to the principal planes of the laser medium 5 is transmitted through the inclined section 12.

However, even when the transmission condition is satisfied, in some case, the spontaneous emission light N is Fresnel-reflected according to a refractive index difference between the laser medium 5 and the clad 4. A reflection amount R of the Fresnel reflection is represented by R=(($n_2$−1)/($n_2$+1))².

A condition under which the spontaneous emission light N parallel to the principal planes of the laser medium 5 is reflected on the inclined section 12 and then transmitted through the clad 4 without being reflected by the clad 4 is indicated by Formula (2).

$$\frac{1}{2}(90 - \theta_m) < \theta_3 < \frac{1}{2}(90 + \theta_m) \quad (2)$$

$\theta_m$ represents a critical angle of the laser medium 5 and the clad 4. n1 represents a refractive index of the clad 4. $n_2$ represents a refractive index of the laser medium 5. $\theta_m$ is represented as $\theta_m$=Sin⁻¹ ($n_1/n_2$). For example, when $n_1$=1.96 and $n_2$=2.2, the critical angle of the laser medium 5 and the clad 4 is $\theta_m$=63°.

Therefore, if the inclination angle $\theta_3$ is set in a range of 13.5°<$\theta_3$<76.5°, the spontaneous emission light N parallel to the principal planes of the laser medium 5 is reflected on the inclined section 12 and then transmitted through the clad 4 without being totally reflected on the clad 4.

According to Formula (1) and Formula (2), the spontaneous emission light N parallel to the principal planes of the laser medium 5 satisfies a condition of Formula (3).

$$\frac{1}{2}\left(90 - \operatorname{Sin}^{-1}\frac{n_1}{n_2}\right) < \theta_3 < \operatorname{Sin}^{-1}\frac{1}{n_2} \quad (3)$$

For example, when $n_1$=1.96 and $n_2$=2.2, if the inclination angle $\theta_3$ is set in a range of 13.5°<$\theta_3$<27°, a part of the spontaneous emission light N parallel to the principal planes of the laser medium 5 passes through the inclined section 12 and a part thereof is reflected on the inclined section 12 according to the Fresnel reflection. The reflected component is transmitted through the clad 4 without being totally reflected on the clad 4.

A condition under which the spontaneous emission light N forming a radiation angle $\theta_a$ with respect to the principal planes of the laser medium 5 (components propagating through the core at the radiation angle $\theta_a$ with respect to the flat surface of the waveguide) is transmitted through the inclined section 12 without being totally reflected on the inclined section 12 is indicated by Formula (4).

$$\theta_3 \pm \theta_a < \operatorname{Sin}^{-1}\frac{1}{n_2} \quad (4)$$

When a maximum radiation angle at which the spontaneous emission light N can propagate through the core is represented as $\theta_{a\text{-}max}$, $\theta_{a\text{-}max}$=90−Sin⁻¹ ($n_1/n_2$). For example, when $n_1$=1.96 and $n_2$=2.2, $\theta_3$<0.02° with respect to the radiation angle $\theta_{a\text{-}max}$. Therefore, the inclined section 12 needs an angle substantially perpendicular to the principal planes of the laser medium 5.

A condition under which the spontaneous emission light N forming the radiation angle $\theta_a$ with respect to the principal planes of the laser medium 5 is reflected on the inclined section 12 and then transmitted through the clad 4 without being totally reflected on the clad 4 is indicated by Formula (5).

$$\frac{1}{2}(90 - \theta_m) < \theta_3 \pm \theta_a < \frac{1}{2}(90 + \theta_m) \quad (5)$$

$\theta_a$ satisfies a condition $\theta_a$=90−$\theta_m$. For example, when $n_1$=1.96 and $n_2$=2.2, $\theta_m$=63°. As a range of an inclination angle, a condition 13.5°<$\theta_3$±27°<76.5° is obtained. However, $\theta_3$ satisfying this condition exceeds a range of 0° to 90°. Therefore, there is no condition (an angle condition for the inclined section 12) for transmitting all components (radiation angle components) propagated at ±$\theta_{a\text{-}max}$ from the laser medium 5 via the inclined section 12 and the clad 4. Therefore, it is desirable to set the inclination angle $\theta_3$ to 45° that is in the center of the angle range of the inclination angle.

In this way, to reduce return beams into the laser medium 5 (the spontaneous emission light N reflected in the core) in both the inclined section 12 and the clad 4, a condition for transmitting a center value in a range of a radiation angle for allowing the spontaneous emission light N to propagate through the laser medium 5 (parallel beams parallel to the principal planes of the laser medium 5) is the best. Therefore, when the inclination angle satisfies the condition of Formula (3), unnecessary spontaneous emission light N can be discharged to the outside of the laser medium 5 at a highest rate. To reduce the return beams into the laser medium 5 only in the clad 4, it is desirable to set the inclination angle to $\theta_3$=45° in the center of the angle range of Formula (5).

Here, a blue laser in which Nd:YVO4 or Nd:GdVO4 is used as the laser medium 5 is explained. In the wavelength conversion laser device 101 of the waveguide type shown in FIG. 1, linear polarized light due to laser oscillation is often obtained according to a gain/loss ratio in the waveguide mode. Therefore, even when linear polarized light is requested for a fundamental wave laser beam in wavelength conversion, a high-luminance fundamental wave laser beam suitable for the wavelength conversion can be output. Further, if a laser medium (Nd:YVO4 or Nd:GdVO4) having a different gain according a crystallographic axis direction is used as the laser medium 5, linear polarized light oscillation in a direction in which a gain is high can be easily obtained. Therefore, even when linear polarized light is requested in a fundamental wave laser beam in the wavelength conversion, a high-luminance fundamental wave laser beam suitable for the wavelength conversion can be output.

The blue laser can be obtained by using a laser medium that outputs a laser beam having a wavelength in a 900 nm band as a fundamental wave and wavelength-converting the fundamental wave into a second harmonic. Because Nd:YVO4 or Nd:GdVO4 has a gain band near 914 nanometers, a blue laser near 457 nanometers can be obtained by using Nd:YVO4 or Nd:GdVO4 as the laser medium 5.

In Nd:YVO4 and Nd:GdVO4, a wavelength with a highest gain is a 1064 nm band. There is also a gain in a wavelength of a 1.3 µm band. Therefore, to cause a fundamental wave in a 914 nm band to efficiently oscillate, it is necessary to suppress extraction of energy due to laser oscillation, parasitic oscillation, and the amplification of spontaneous emission light in an unintended direction in the 1064 nm band having the highest gain and oscillation in the 1.3 µm band.

To suppress laser oscillation in the 1064 nm band and the 1.3 µm band in the optical axis 6 direction, the total reflection film (the end face 5a) that reflects the fundamental wave laser beam of the laser medium 5 is, for example, a film that totally reflects a wavelength in the 914 m band as a fundamental wave of the blue laser and transmits wavelengths in the 1064 nm band and the 1.3 µm band. The reflection preventing film (the end face 5b) that transmits the fundamental wave laser beam is, for example, a film that transmits all the wavelengths in the 914 nm band, the 1064 nm band, and the 1.3 µm band. Further, the optical film (the end face 7a) that transmits the fundamental wave laser beam of the nonlinear material 7 and reflects the second harmonic laser beam L is, for example, a film that transmits all the wavelengths in the 914 nm band, the 1064 nm band, and the 1.3 µm band. The optical film (the end face 7b) that reflects the fundamental wave laser beam and transmits the second harmonic laser beam L is, for example, a film that totally reflects the wavelength in the 914 nm band and transmits the wavelengths in the 1064 nm band and the 1.3 µm band.

With such a film configuration of the laser medium 5, the wavelength conversion laser device 101 can perform, while suppressing laser oscillation in the 1064 nm band and the 1.3 µm band in the optical axis 6 direction, laser oscillation in the 914 nm band between the total reflection film (the end face 5a) that reflects the fundamental wave laser beam and the optical film (the end face 7b) that reflects the fundamental wave laser beam and transmits the second harmonic laser beam L. Consequently, a blue laser in a 457 nm band converted into a second harmonic by the nonlinear material 7 is output.

For example, when the second harmonic is generated by using the 1064 nm band as the wavelength of the fundamental wave, because the second harmonic laser beam L in a 532 nm band is output from the nonlinear material 7, a green laser can be obtained. In this case, a laser oscillation threshold value is low because the wavelength in the 1064 nm band has a high gain. Laser oscillation in the optical axis 6 direction can be easily performed. Because the laser oscillation threshold value is low, a gain remaining in the laser medium 5 is small. Parasitic oscillation in an unintended direction other than the optical axis 6 direction, extraction of energy due to amplification spontaneous emission light, and laser oscillation in other wavelengths such as the 914 nm band and the 1.3 µm band in the optical axis 6 direction hardly occur. Therefore, even when an increase in power of a laser beam is realized by increasing a beam diameter in the y direction or changing the laser beam into multiple beams in the plane waveguide laser, parasitic oscillation of a laser beam propagating at the angle including the x-axis direction and extraction of energy due to the amplification of spontaneous emission light also hardly occur. Therefore, a high-power green laser can be easily obtained.

When the fundamental wave is the 914 nm band having a low gain, a laser oscillation threshold value is high because the gain is low. Therefore, even when laser oscillation in the 1064 nm band and the 1.3 µm band in the optical axis 6 direction is suppressed by the film configuration of the laser medium 5, because the laser oscillation threshold value is high, a gain in an unintended angle direction including the x-axis direction is also high. Unintended parasitic oscillation and the amplification of spontaneous emission light may occur. Further, when a beam width is increased in the x direction or a laser beam is changed to multiple beams in the plane waveguide laser, a gain in the angle direction including the x-axis direction increases and parasitic oscillation tends to occur. Even when the parasitic oscillation does not occur, extraction of energy due to the amplification of spontaneous emission light increases because a propagation length of the laser beam is large. A gain in the optical axis 6 direction is reduced. Therefore, the power of the fundamental wave laser in the 914 nm band in the optical axis 6 direction falls and the power of the blue laser of the second harmonic may also fall.

In this embodiment, because the inclined sections 12 are formed on the sides of the laser medium 5, spontaneous emission light in the x-axis direction can be suppressed. As a result, parasitic oscillation of the spontaneous emission light oscillating at an angle (an unintended angle) including the x-axis direction can be suppressed. Even when the parasitic oscillation does not occur, extraction of energy due to the amplification of the spontaneous emission light can be suppressed.

Therefore, even when laser oscillation with the 914 nm band having the high laser oscillation threshold value set as a fundamental wave is performed, because a fall in a gain due to extraction of energy is small, a high-power fundamental wave laser beam can be obtained. Because the laser power of the fundamental wave is high, wavelength conversion efficiency in the nonlinear material 7 is high. A blue laser L as the high-power second harmonic laser beam L can be obtained.

In the explanation with reference to FIG. 1 and the like, the wavelength conversion laser device 101 adopts an internal wavelength conversion system for arranging the nonlinear material 7 in the oscillator of a fundamental wave and causing the fundamental wave to oscillate between the total reflection film (the end face 5a) of the laser medium 5 and the optical film (the end face 7b) of the nonlinear material 7. However, the wavelength conversion laser device 101 can perform wavelength conversion according to an external wavelength conversion system. In the external wavelength conversion system, a wavelength conversion element is set on the outside of a resonator. For example, a partial reflection film that reflects a part of a fundamental wave laser beam is formed on one end face of the laser medium 5 (which is a side opposed to the end face 5a and is an end face on the side close to the nonlinear material 7). The wavelength conversion laser device 101 performs laser oscillation of the fundamental wave laser beam on both the end faces (the end face 5a and the partial reflection film) of the laser medium 5. In this case, a fundamental wave output from the laser medium 5 is made incident on the nonlinear material 7, wavelength conversion is performed in the nonlinear material 7, and the second harmonic laser beam L is obtained.

Even in such an external wavelength conversion system, as in the internal wavelength conversion system, parasitic oscillation in an unintended direction can be suppressed and extraction of energy due to the amplification of spontaneous emission light in an unintended direction can be suppressed. Therefore, even if the wavelength conversion laser device 101 adopts the external wavelength conversion system, a high-power fundamental wave in the optical axis 6 direction can be obtained. As a result, a high-power second harmonic laser L can be obtained.

As explained above, according to the first embodiment, the inclined sections 12 reflect the spontaneous emission light N in the x-axis direction to the upper surface side of the laser medium 5. Therefore, the parasitic oscillation in directions other than the optical axis 6 direction and the extraction of energy due to the amplification of the spontaneous emission light N decrease and the decrease in the gain in the optical axis 6 direction is reduced. Therefore, the solid-state laser element 50 can output a high-power laser.

Second Embodiment

Next, a second embodiment of the present invention is explained with reference to FIGS. 9 to 14. In the second embodiment, wing sections 13 explained later are disposed on the outer sides in the x-axis direction of the clad 4 as means for allowing the spontaneous emission light N to escape to the outside of the laser medium 5 (transmission or absorption) or means for diffusing the spontaneous emission light N.

Figure 9:
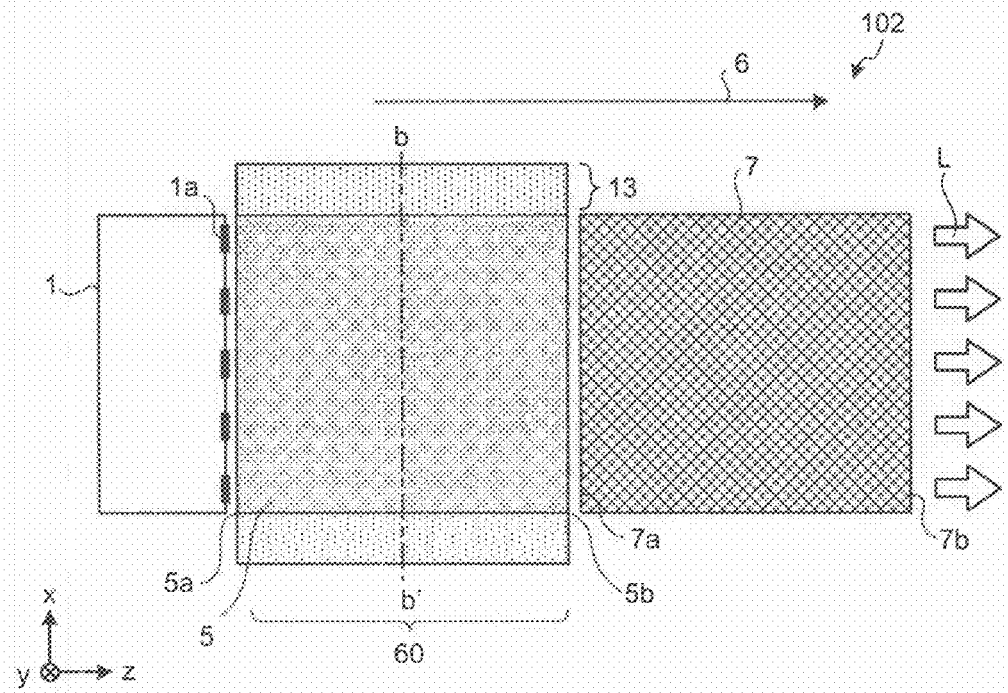
FIG. 9 is a top view of the configuration of a wavelength conversion laser device according to a second embodiment.

FIG. 9 is a top view of the configuration of a wavelength conversion laser device according to the second embodiment of the present invention. A sectional configuration of a wavelength conversion laser device 102 according to the second embodiment viewed from a side is the same as that of the wavelength conversion laser device 101 according to the first embodiment shown in FIG. 2. Components that attain functions same as those of the wavelength conversion laser device 101 according to the first embodiment shown in FIG. 1 among components shown in FIG. 9 are denoted by the same numerals and redundant explanation of the components is omitted.

The wavelength conversion laser device 102 of the plane waveguide type includes the semiconductor laser 1, the nonlinear material 7, and a solid-state laser element 60 as a main characteristic of the present invention. The wavelength conversion laser device 102 performs laser oscillation and performs wavelength conversion for a fundamental wave laser beam according to processing same as that performed by the wavelength conversion laser device 101. In this embodiment, the width in the x-axis direction of the laser medium 5 is set larger than the width in the x-axis direction of the clad 4. A pair of wing sections 13 are formed on both the outer sides in the x-axis direction of the clad 4.

The laser medium 5 (the solid-state laser element 60) according to this embodiment has the wing sections 13 near sides perpendicular to the end faces 5a and 5b, respectively. The wing sections 13 are formed in a flat shape parallel to the xz plane. A principal plane thereof viewed from the upper surface is formed in a substantially rectangular shape. The length in the optical axis 6 direction of the wing sections 13 is substantially the same as the length in the optical axis 6 direction of the principal planes of the laser medium 5. The width in the x-axis direction of the clad 4 is substantially the same as the width in the x-axis direction of the semiconductor laser 1 and the nonlinear material 7. The wing sections 13 diffuse the spontaneous emission light N in the x-axis direction or transmit the spontaneous emission light N to the outside.

Figure 10:
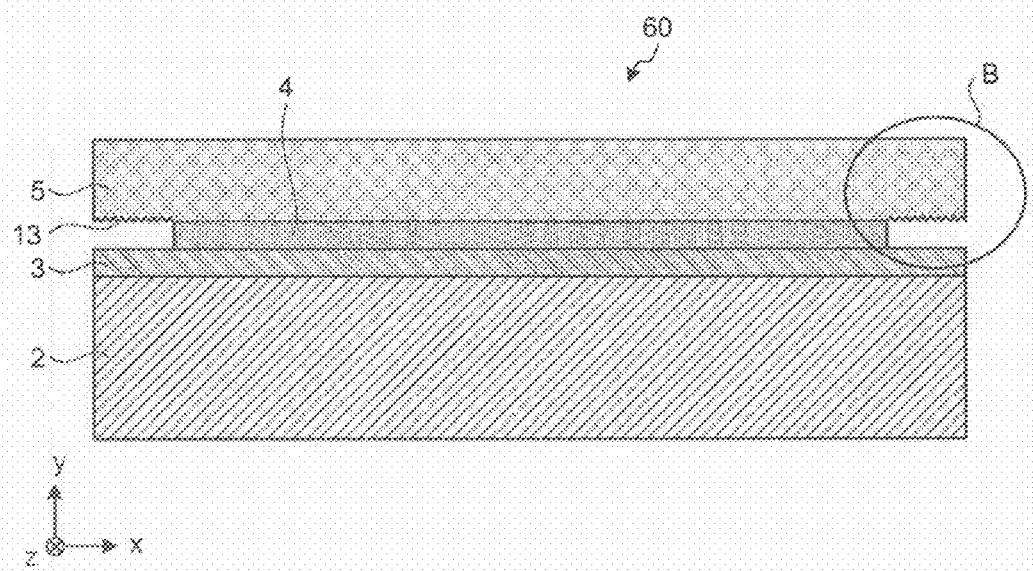
FIG. 10 is a b-b' sectional view of FIG. 9.

FIG. 10 is a b-b' sectional view of FIG. 9. As shown in FIG. 10, the width in the x-axis direction of the clad 4 is smaller than the width in the x direction of the laser medium 5 and the like. The wing sections 13 are formed between the laser medium 5 and the bonding agent 3 and arranged to be close to the sides extending in the z-axis direction among the sides of the clad 4. Consequently, the wing sections 13 are formed in a flat shape having principal planes in planes same as the principal planes of the clad 4. The principal plane width on the upper surface side of the laser medium 5 is larger than the principal plane width of a bonding surface bonded with the clad 4. In the solid-state laser element 60, the laser medium 5 operates as a core in the xz plane and forms a waveguide.

The wing sections 13 allow the spontaneous emission light N in the x-axis direction to escape to the outer side of the laser medium 5 or diffuse the spontaneous emission light N. Therefore, the spontaneous emission light N deviates from the total reflection condition for the waveguide and leaks to the outside of the waveguide. Consequently, the amplification of the spontaneous emission light N in the x-axis direction decreases. Therefore, even when the semiconductor laser 1 having large width in the x-axis direction or the semiconductor laser 1 in which a plurality of active layers 1a are arranged is used as an excitation source, parasitic oscillation and extraction of energy due to the amplification of spontaneous emission light decrease.

Figure 11:
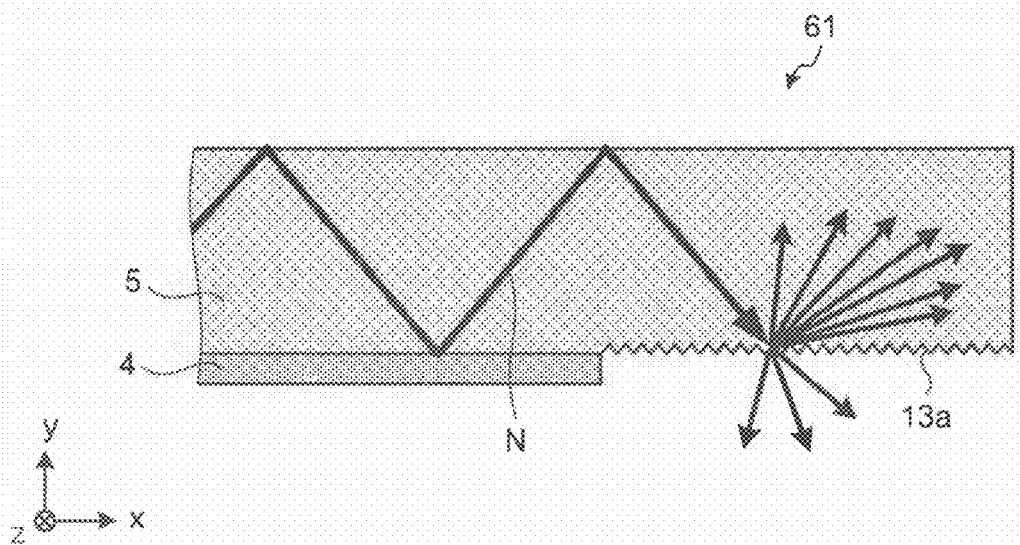
FIG. 11 is an enlarged view (1) of a B section shown in FIG. 10.
Figure 12:
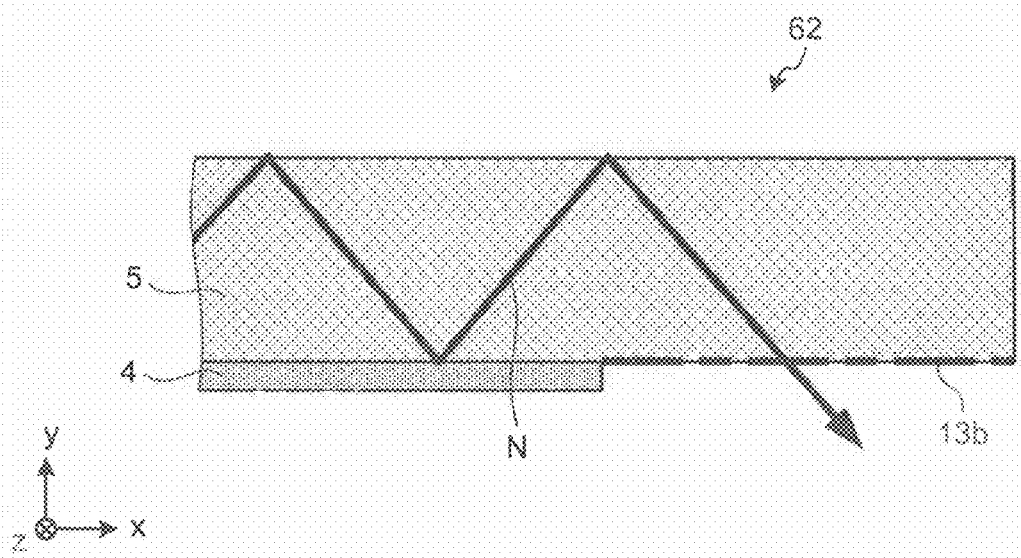
FIG. 12 is an enlarged view (2) of the B section shown in FIG. 10.

FIG. 11 is an enlarged view (1) of a B section shown in FIG. 10. FIG. 12 is an enlarged view (2) of the B section shown in FIG. 10. In FIG. 11, the B section shown in FIG. 10 is shown as a solid-state laser element 61. In FIG. 12, the B section shown in FIG. 10 is shown as a solid-state laser element 62.

The wing section 13 of the solid-state laser element 61 shown in FIG. 11 is a roughened surface 13a of the laser medium 5 that transmits a part of the spontaneous emission light N while diffusing the same and reflects a part of the spontaneous emission light N while diffusing the same. In other words, a section (the wing section 13) not bonded to the clad 4 in the lower surface of the laser medium 5 is roughened to form the roughened surface 13a in the wing section 13.

In this case, a part of the spontaneous emission light N entering the roughened surface 13a side (the spontaneous emission light N in the x-axis direction, etc.) is reflected on the roughened surface 13a while being diffused. Further, a part of the spontaneous emission light N entering the roughened surface 13a side is transmitted through the roughened surface 13a while being diffused and travels to the outer side of the laser medium 5. A part of the spontaneous emission light N diffused by the roughened surface 13a deviates from the total reflection condition for the waveguide. Therefore, parasitic oscillation and the spontaneous emission light N to be amplified decrease.

The wing section 13 of the solid-state laser element 62 shown in FIG. 12 is a reflection preventing film 13b that transmits the spontaneous emission light N. In other words, the reflection preventing film 13b is disposed in the section not bonded to the clad 4 in the lower surface of the laser medium 5.

In this case, the spontaneous emission light N entering the reflection preventing film 13b side is transmitted through the reflection preventing film 13b and travels to the outer side of the laser medium 5. Consequently, parasitic oscillation and the spontaneous emission light N to be amplified decrease.

In the explanation of this embodiment, the width in the x-axis direction of the heat sink 2 and the bonding agent 3 is the same as the width in the x-axis direction of the laser medium 5. However, the width in the x-axis direction of the heat sink 2 and the bonding agent 3 can be the same as the width in the x-axis direction of the clad 4.

An absorbent ($Cr^{4+}$:YAG, carbon, etc.) for the spontaneous emission light N can be bonded to the wing section 13 instead of the reflection preventing film 13b. In this case, the upper surface side of the wing section 13 is not limited to the laser medium 5 and can be the absorbent for the spontaneous emission light N.

Figure 13:
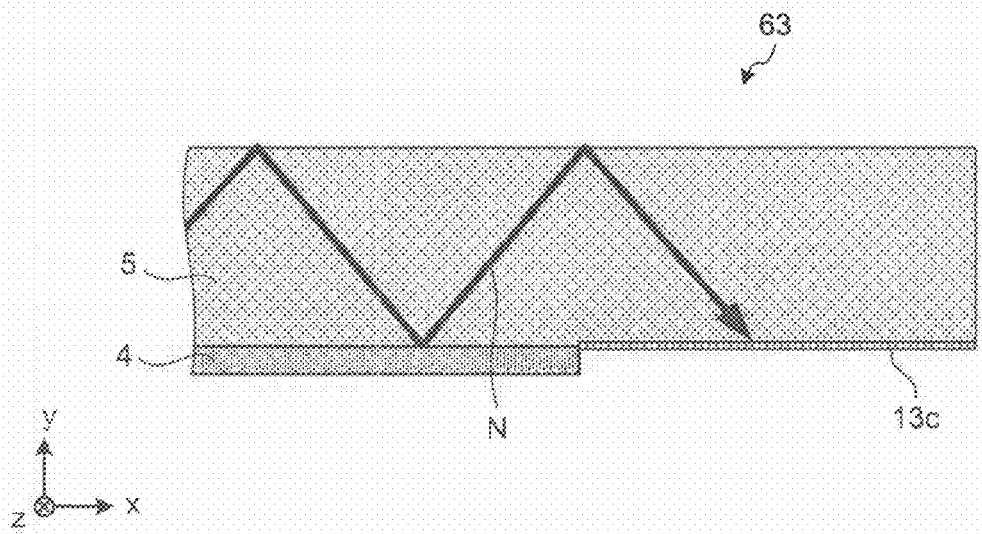
FIG. 13 is an enlarged view (3) of the B section shown in FIG. 10.
Figure 14:
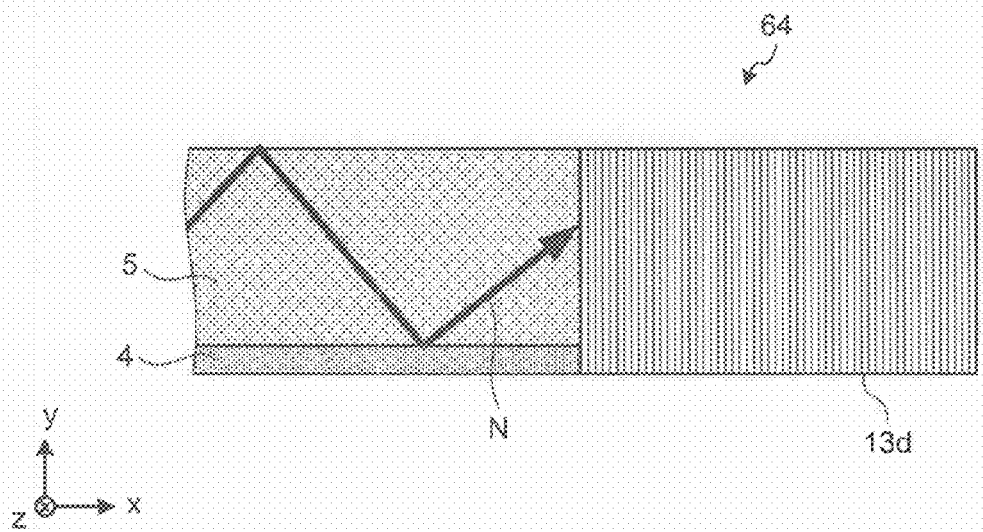
FIG. 14 is an enlarged view (4) of the B section shown in FIG. 10.

FIG. 13 is an enlarged view (3) of the B section shown in FIG. 10. FIG. 14 is an enlarged view (4) of the B section shown in FIG. 10. In FIG. 13, the B section shown in FIG. 10 is shown as a solid-state laser element 63. In FIG. 14, the B section shown in FIG. 10 is shown as a solid-state laser element 64.

The wing section 13 of the solid-state laser element 63 shown in FIG. 13 and the wing section 13 of the solid-state laser element 64 shown in FIG. 14 are absorbents 13c and 13d that absorb the spontaneous emission light N. In FIG. 13, the absorbent 13c is disposed in the section not bonded to the clad 4 in the lower surface of the laser medium 5. In FIG. 14, the absorbent 13d is disposed on a side of the laser medium 5 and a side of the clad 4.

In the solid-state laser elements 63 and 64, the spontaneous emission light N entering the absorbents 13c and 13d side is absorbed by the absorbents 13c and 13d. Consequently, parasitic oscillation and the spontaneous emission light N to be amplified decrease.

The wing section 13 can be disposed on the upper surface side of the laser medium 5 or can be disposed on both the upper surface side and the lower surface side of the laser medium 5. The principal plane of the roughened surface 13a is not limited to be present in a surface same as the upper surface of the clad 4 (in a case where positions in the y-axis direction are same each other) and can be present further on the lower side or the upper side than the upper surface of the clad 4.

As explained above, according to the second embodiment, the wing sections 13 diffuse the spontaneous emission light N in the x-axis direction or transmit the spontaneous emission light N to the outer side of the laser medium 5. Therefore, the parasitic oscillation in directions other than the optical axis 6 direction and the extraction of energy due to the amplification of the spontaneous emission light N decrease, and the decrease in the gain in the optical axis 6 direction is reduced. Therefore, the solid-state laser element 60 can output a high-power laser.

Third Embodiment

A third embodiment of the present invention is explained with reference to FIG. 2 and FIGS. 15 to 20. In the third embodiment, wing sections 14 explained later obtained by forming grooves in the laser medium 5 are disposed on outer sides in the x-axis direction of the clad 4 as means for allowing the spontaneous emission light N to escape to the outside of the laser medium 5 (transmitting or absorbing the spontaneous emission light N) or means for diffusing the spontaneous emission light N.

Figure 15:
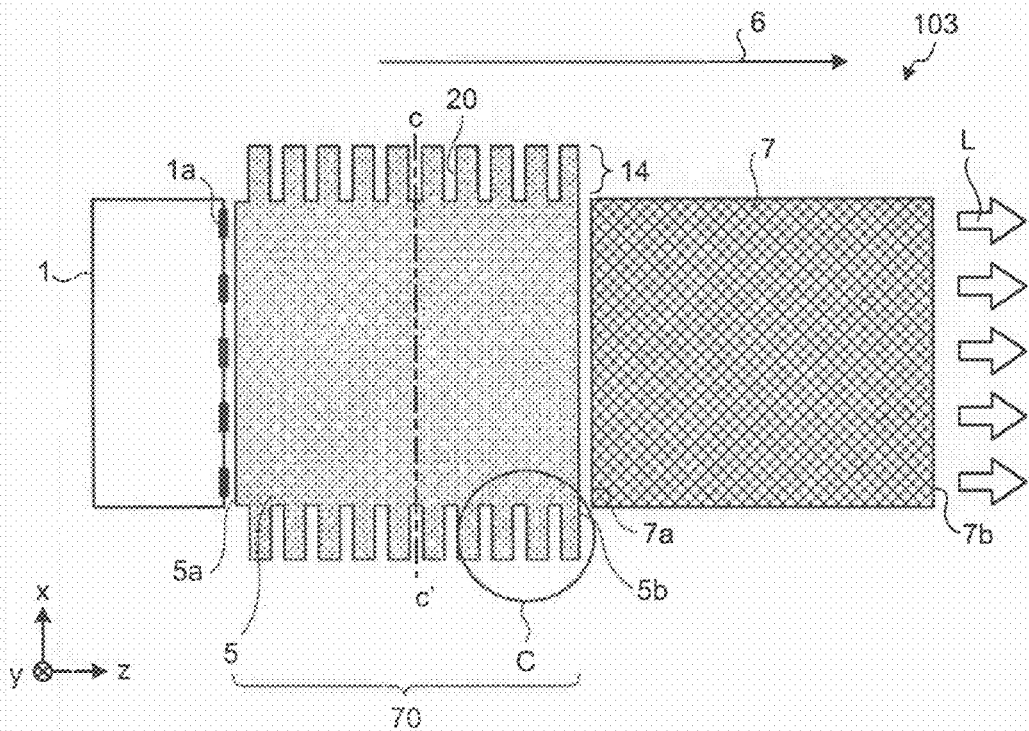
FIG. 15 is a top view of the configuration of a wavelength conversion laser device according to a third embodiment.

FIG. 15 is a top view of the configuration of a wavelength conversion laser device according to the third embodiment of the present invention. Components that attain functions same as those of the wavelength conversion laser device 101 according to the first embodiment shown in FIG. 1 and the wavelength conversion laser device 102 according to the second embodiment shown in FIG. 9 among components shown in FIG. 15 are denoted by the same numerals and redundant explanation of the components is omitted.

A wavelength conversion laser device 103 of the plane waveguide type includes the semiconductor laser 1, the non-linear material 7, and a solid-state laser element 70 as a main characteristic of the present invention. In the solid-state laser element 70, the laser medium 5 operates as a core in the xz plane and forms a waveguide.

The wavelength conversion laser device 103 performs laser oscillation and performs wavelength conversion for a fundamental wave laser beam according to processing same as that performed by the wavelength conversion laser device 101. In this embodiment, the width in the x-axis direction of the laser medium 5 is set larger than the width in the x-axis direction of the clad 4. The wing sections 14 are respectively formed further on outer sides in the x-axis direction than the clad 4 (near the sides perpendicular to the end faces 5a and 5b). The wing sections 14 are formed on the upper side of the clad 4 and arranged to be close to the sides extending in the z-axis direction among the sides of the laser medium 5. The wing sections 14 are formed in a flat shape parallel to the xz plane. Principal planes thereof viewed from the upper surface are formed in a substantially rectangular shape.

The length in the optical axis 6 direction of the wing sections 14 is length substantially the same as the length in the optical axis 6 direction of the principal planes of the laser medium 5. In the wing sections 14, areas of the laser medium 5 and areas of a roughened surface 20 are alternately arranged in the optical axis 6 direction. Consequently, the wing sections 14 are formed in a comb tooth shape obtained by arranging a plurality of roughened surfaces 20 in the laser medium 5. The roughened surfaces 20 are formed on groove wall surfaces formed to cut into the laser medium 5 (groove wall surfaces formed to extend in the principal plane width direction). In other words, groove wall surfaces formed in the laser medium 5 (boundary surfaces between grooves and the laser medium 5) among grooves of the comb tooth shape formed in the wing sections 14 are the roughened surfaces 20. The wing sections 14 diffuse the spontaneous emission light N in the x-axis direction in the wing sections 14 with the roughened surfaces 20.

The wing sections 14 diffuse the spontaneous emission light N in the x-axis direction with the roughened surfaces 20. Therefore, because the spontaneous emission light N deviates from the total reflection condition for the waveguide and leaks to the outside of the waveguide, the amplification of the spontaneous emission light N in the x-axis direction decreases. Therefore, even when the semiconductor laser 1 having large width in the x-axis direction or the semiconductor laser 1 in which a plurality of active layers 1a are arranged is used as an excitation source, parasitic oscillation and extraction of energy due to the amplification of the spontaneous emission light N decrease.

Figure 16:
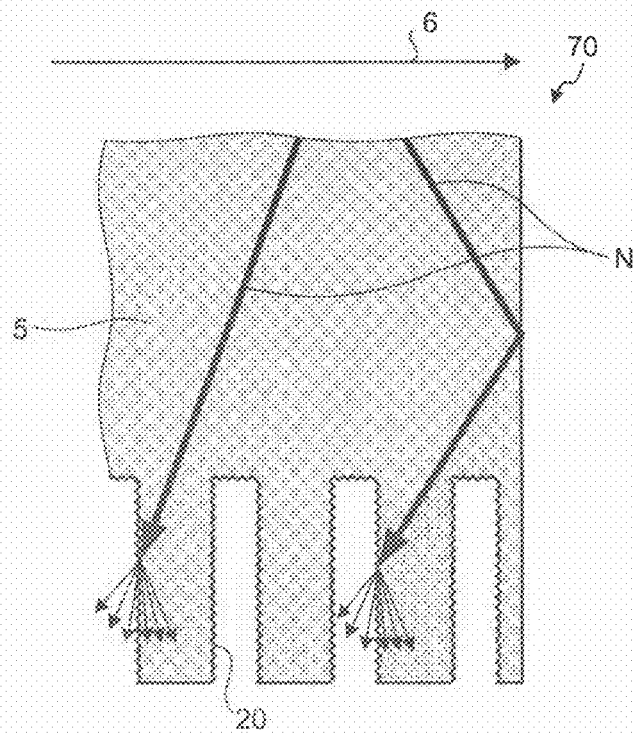
FIG. 16 is an enlarged view of a C section shown in FIG. 15.

FIG. 16 is an enlarged view of a C section shown in FIG. 15. The wing section 14 of the solid-state laser element 70 includes the roughened surfaces 20 that transmit a part of the spontaneous emission light N while diffusing the same and reflect a part of the spontaneous emission light N while diffusing the same. In other words, a section not bonded to the clad 4, which is a section in which the groove wall surfaces are formed, in the lower surface of the laser medium 5 is roughened to form the roughened surfaces 20 in the wing section 14.

In this case, a part of the spontaneous emission light N entering the wing section 14 side is reflected on the roughened surface 20 while being diffused. When the spontaneous emission light N reflected on the roughened surface 20 while being diffused collides with another roughened surface 20 in the wing section 14, the spontaneous emission light N is reflected on the other roughened surface 20 while being diffused. A part of the spontaneous emission light N entering the roughened surface 13a side is transmitted through the roughened surface 20 while being diffused and travels to the outer side of the laser medium 5. The spontaneous emission light N repeats the reflection on the roughened surface 20 and the transmission through the roughened surface 20 while the spontaneous emission light N propagates through the wing section 14. A part of the spontaneous emission light N diffused and reflected on the roughened surface 20 deviates from the total reflection condition for the waveguide. Consequently, parasitic oscillation and the spontaneous emission light N to be amplified decrease.

Figure 17:
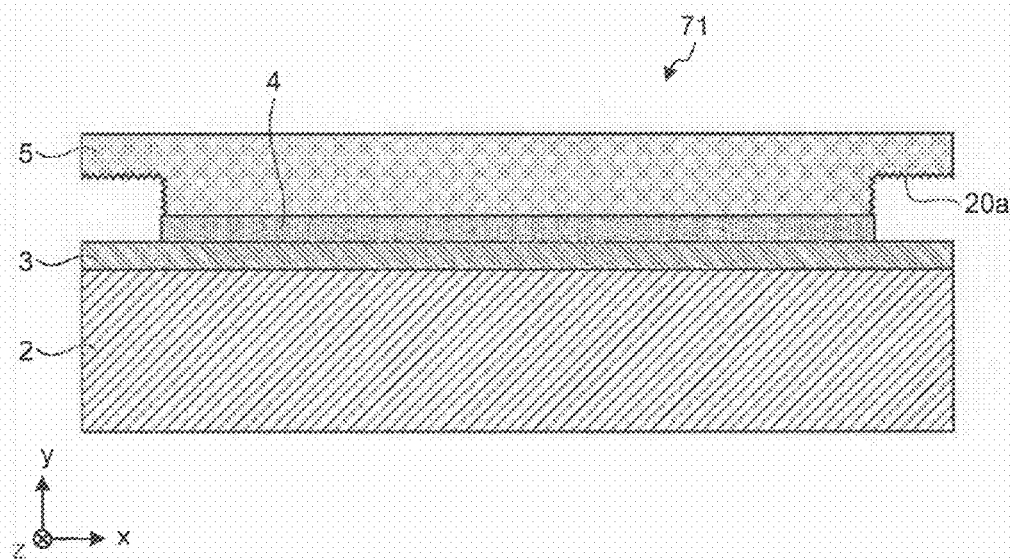
FIG. 17 is a c-c' sectional view (1) of FIG. 15.
Figure 18:
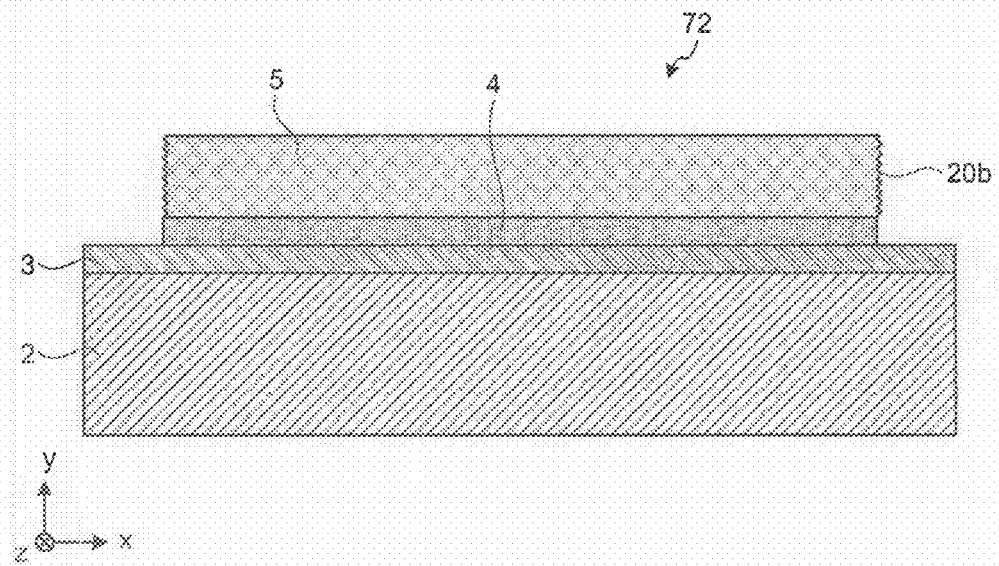
FIG. 18 is a c-c' sectional view (2) of FIG. 15.
Figure 19:
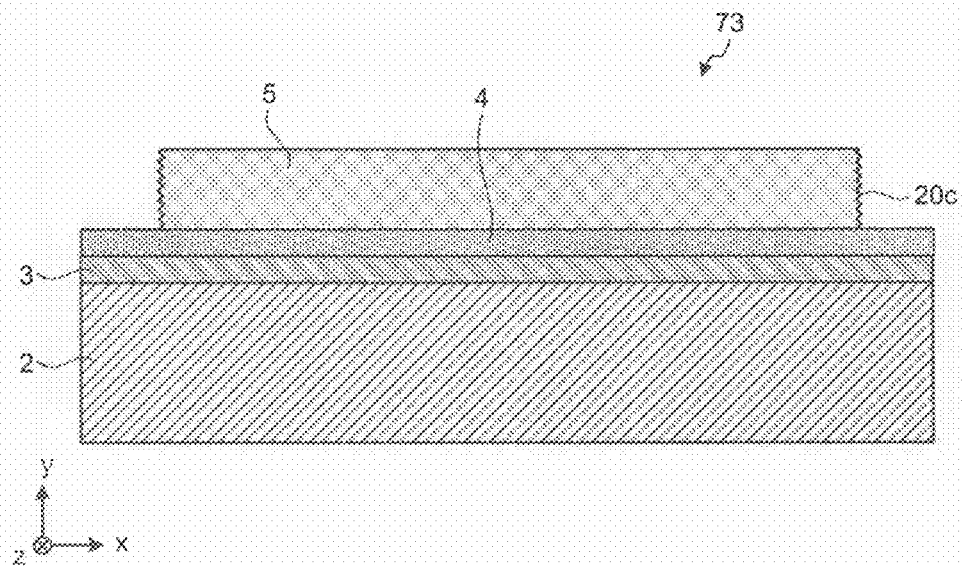
FIG. 19 is a c-c' sectional view (3) of FIG. 15.

FIG. 17 is a c-c' sectional view (1) of FIG. 15. FIG. 18 is a c-c' sectional view (2) of FIG. 15. FIG. 19 is a c-c' sectional view (3) of FIG. 15. In FIGS. 17 to 19, the solid-state laser element 70 shown in FIG. 15 is shown as solid-state laser elements 71 to 73, respectively. The roughened surfaces 20 shown in FIG. 15 are shown as roughened surfaces 20a to 20c, respectively.

In the solid-state laser element 71 shown in FIG. 17, the roughened surfaces 20a are disposed such that the height in the y-axis direction of principal planes of the roughened surfaces 20a (upper surfaces formed in the xz plane) is between the upper surface and the lower surface of the laser medium 5. Sides of the roughened surfaces 20a (sides formed in the yz plane) are disposed to be located in surfaces same as the sides of the clad 4. In the solid-state laser element 71, the lower surface side of the wing section 14 is drilled to form the roughened surfaces 20a. Consequently, the roughened surfaces 20a have sections parallel to the xz plane, sections parallel to the yz plane, and sections parallel to the xy plane. Because the grooves formed in the wing section 14 reach the lower surface side of the clad 4, roughened surfaces corresponding to lower surfaces of the grooves are not present.

In the solid-state laser element 72 shown in FIG. 18, sides of roughened surfaces 20b are disposed to be located in surfaces same as the sides of the clad 4 (in the yz plane). Consequently, the roughened surfaces 20b have sections parallel to the yz plane and sections parallel to the xy plane. Because the grooves formed in the wing section 14 reach the lower surface side of the clad 4, roughened surfaces corresponding to lower surfaces of the grooves are not present. Because the grooves formed in the wing section 14 reach the upper surface side of the laser medium 5, roughened surfaces corresponding to upper surfaces of the grooves are not present.

In the solid-state laser element 73 shown in FIG. 19, sides of the roughened surfaces 20c are disposed to be located in surfaces same as the sides of the clad 4. Consequently, the roughened surfaces 20c have sections parallel to the yz plane and sections parallel to the xy plane. Because the grooves formed in the wing section 14 reach the upper surface side of the clad 4, roughened surfaces corresponding to lower surfaces of the grooves are not present. Because the grooves formed in the wing section 14 reach the upper surface side of the laser medium 5, roughened surfaces corresponding to upper surfaces of the grooves are not present.

When the roughened surfaces 20a are formed in the wing section 14, the upper surface side of the wing section 14 can be drilled to form the roughened surfaces 20a or both the upper surface side and the lower surface side can be drilled to form the roughened surfaces 20a.

The shape of the grooves is not limited to the rectangular shape viewed from the upper surface and can be other shapes. For example, distal ends of the grooves can be tapered by setting the width of the grooves formed on the inner side of the laser medium 5 smaller than the width of the grooves formed on the outer side of the laser medium 5. The groove wall surfaces are not limited to straight surfaces and can be curved surfaces. Principal planes of the groove wall surfaces can be inclined not to be parallel to the principal planes of the laser medium 5 or can be inclined not to be parallel to the end faces 5a and 5b of the laser medium 5.

For example, when the principal planes of the groove wall surfaces are inclined, the principal planes of the groove wall surfaces can be inclined in a longitudinal direction thereof (the x-axis direction) or can be inclined in a latitudinal direction thereof (the z-axis direction). When the principal planes of the groove wall surfaces are inclined in the longitudinal direction, the groove wall surfaces incline like the inclined sections 12 explained with reference to FIG. 3 in the first embodiment.

Figure 20:
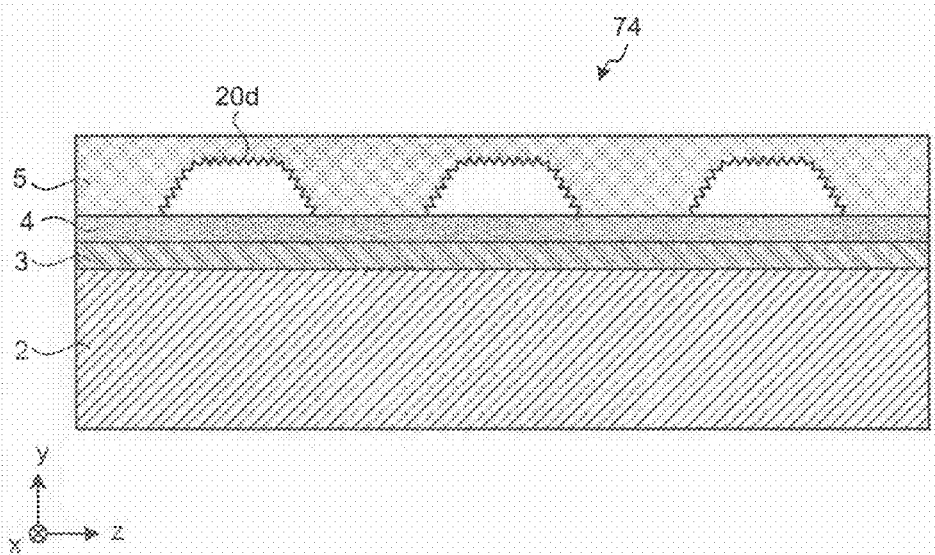
FIG. 20 is a sectional view of a wing section in which principal planes of groove wall surfaces are inclined in a latitudinal direction.

FIG. 20 is a sectional view of a wing section in which principal planes of groove wall surfaces are inclined in the latitudinal direction. In FIG. 20, a sectional configuration of a side of the solid-state laser element 70 viewed from the principal plane width direction is shown. In FIG. 20, the solid-state laser element 70 shown in FIG. 15 is shown as a solid-state laser element 74 and the roughened surface 20 shown in FIG. 15 is shown as roughened surfaces 20d.

In the solid-state laser element 74, sides of the roughened surfaces 20d are inclined by a predetermined angle from the y-axis direction not to be parallel to the y-axis direction. Consequently, the roughened surfaces 20d have sections parallel to the xz plane (principal planes of the groove wall surfaces) and inclined sides (inclined surfaces).

Because the roughened surfaces 20d incline in the principal plane direction of the laser medium 5, when the spontaneous emission light N is made incident on the roughened surfaces 20, the roughened surfaces 20d reflect this spontaneous emission light N to the principal plane side of the laser medium 5. Therefore, when the groove wall surfaces are inclined, roughened surfaces do not have to be formed on the groove wall surfaces.

Figure 21:
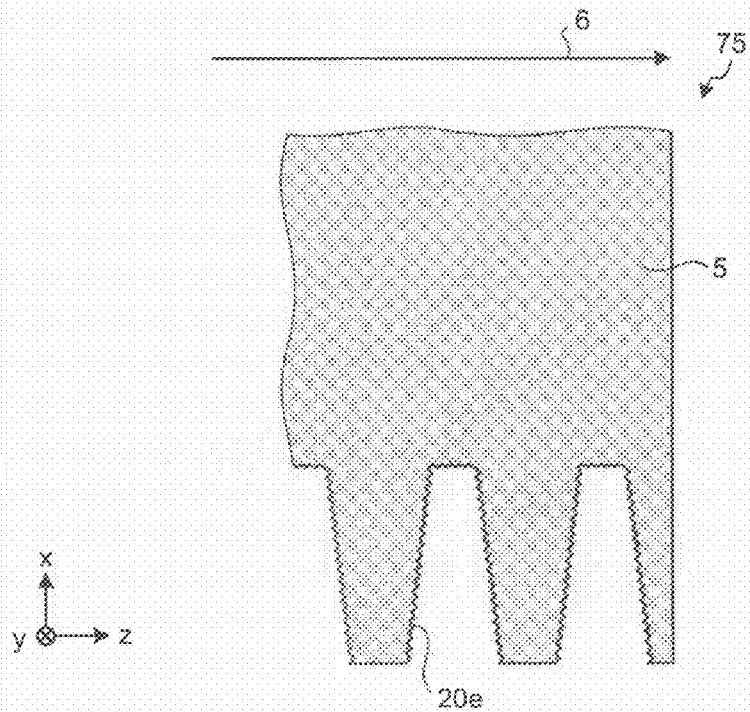
FIG. 21 is a sectional view of a wing section in which sides of grooves adjacent to each other are non-parallel to each other.

Grooves can be formed in the laser medium 5 such that sides of adjacent grooves among the groove wall surfaces are non-parallel to each other. FIG. 21 is a sectional view of a wing section in which sides of adjacent grooves are non-parallel to each other. In FIG. 21, a top view of the solid-state laser element 70 is shown. In FIG. 21, the solid-state laser element 70 shown in FIG. 15 is shown as a solid-state laser element 75 and the roughened surfaces 20 shown in FIG. 15 are shown as roughened surfaces 20e. When the grooves are disposed such that the sides of the grooves are non-parallel to each other, the spontaneous emission light N in the x-axis direction tends to deviate from the total reflection condition for the waveguide. Therefore, parasitic oscillation and the spontaneous emission light N to be amplified decrease. In this way, the shape of the grooves can be, for example, pole shapes such as a square pole shape, a triangular pole shape, and a columnar shape or can be a pyramid shape, a triangular pyramid shape, and a conical shape.

The configuration of the roughened surface 13a, the reflection preventing film 13b, and the absorbents 13c and 13d explained with reference to FIGS. 11 to 14 in the second embodiment can be applied to the solid-state laser element 70 shown in FIG. 15. In this case, the roughened surface 13a and the reflection preventing film 13b are formed in positions corresponding to the lower surfaces of the grooves.

The configuration of the inclined sections 12 explained with reference to FIG. 3 in the first embodiment can be applied to the solid-state laser element 70 shown in FIG. 15. In this case, the inclined sections 12 are formed by inclining sections other than places where the grooves are formed in the wing sections 14.

As explained above, according to the third embodiment, the wing sections 14 transmit a part of the spontaneous emission light N while diffusing the same and reflect a part of the spontaneous emission light N while diffusing the same with the roughened surfaces 20. Therefore, the parasitic oscillation in directions other than the optical axis 6 direction and the extraction of energy due to the amplification of the spontaneous emission light N decrease, and the decrease in the gain in the optical axis 6 direction is reduced. Because a plurality of grooves of the roughened surfaces 20 and the like are arranged in a comb tooth shape in the laser medium 5, the spontaneous emission light N in the x-axis direction can be efficiently diffused. Therefore, the solid-state laser element 70 can output a high-power laser.

Fourth Embodiment

A fourth embodiment of the present invention is explained with reference to FIG. 22. In the fourth embodiment, a pair of wing sections are provided on both the sides of the laser medium 5 by extending the laser medium 5 in the principal plane width direction such that the sides of the laser medium 5 are non-parallel to each other.

Figure 22:
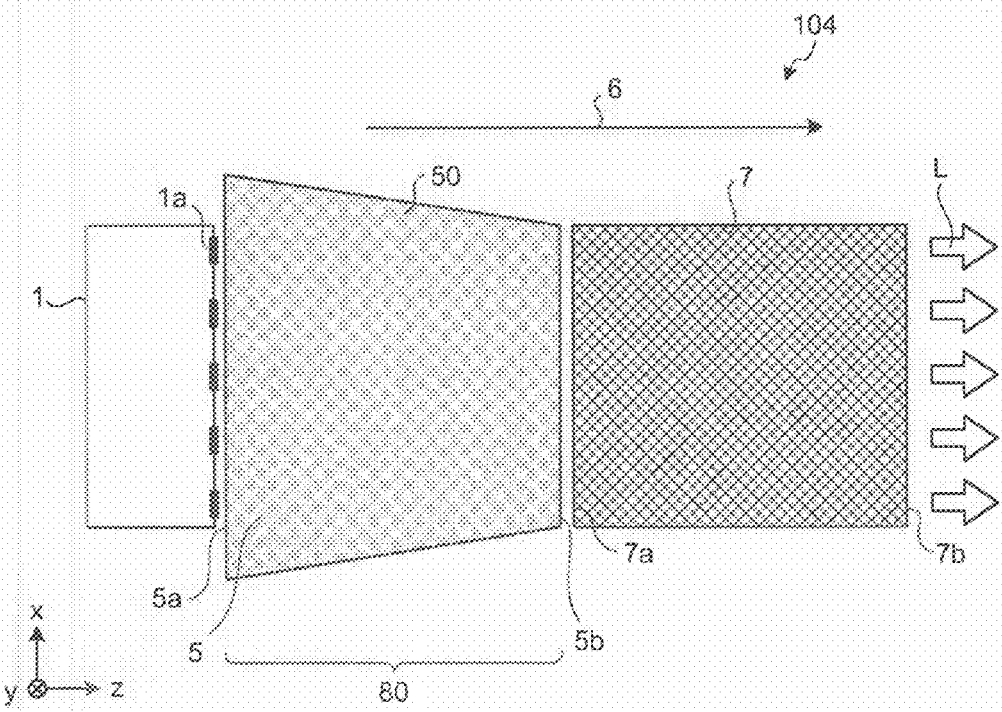
FIG. 22 is a top view of the configuration of a wavelength conversion laser device according to a fourth embodiment.

FIG. 22 is a top view of the configuration of a wavelength conversion laser device according to the fourth embodiment of the present invention. Components that attain functions same as those of the wavelength conversion laser device 101 according to the first embodiment shown in FIG. 1 among components shown in FIG. 22 are denoted by the same numerals and redundant explanation of the components is omitted.

A wavelength conversion laser device 104 of the plane waveguide type includes the semiconductor laser 1, the nonlinear material 7, and a solid-state laser element 80 as a main characteristic of the present invention. In the solid-state laser element 80, the laser medium 5 operates as a core in the xz plane and forms a waveguide.

The wavelength conversion laser device 104 performs laser oscillation according to processing same as that performed by the wavelength conversion laser device 101 and performs wavelength conversion for a fundamental wave laser beam. In the laser medium 5, when the width in the x-axis direction is fixed (when the sides are parallel to each other), the spontaneous emission light N tends to be amplified.

Therefore, in this embodiment, the laser medium 5, the width in the x-axis direction of which is not fixed, is disposed. Specifically, the width in the x-axis direction of the laser medium 5 is partially increased to prevent the width in the x-axis direction of the laser medium 5 from becoming narrower than the width in the x-axis direction of a LD-beam emitting surface of the semiconductor laser 1 and the end face 7b of the nonlinear material 7. Consequently, the principal surfaces of the laser medium 5 are formed in a trapezoidal shape or the like to prevent the sides of the laser medium 5 (the sides other than the end faces 5a and 5b) from becoming parallel to each other.

Because the sides of the laser medium 5 are not parallel to each other, the spontaneous emission light N in the x-axis direction deviates from the total reflection condition for the waveguide. Consequently, the amplification of the spontaneous emission light N in the x-axis direction decreases. Therefore, even when the semiconductor laser 1 having large width in the x-axis direction or the semiconductor laser 1 in which a plurality of active layers 1a are arranged is used as an excitation source, the parasitic oscillation and the extraction of energy due to the amplification of the spontaneous emission light decrease.

In the explanation of this embodiment, the sides of the laser medium 5 are straight surfaces. However, the sides of the laser medium 5 can be curved surfaces. The inclined sections 12 explained in the first embodiment, the wing sections 13 explained in the second embodiment, the wing sections 14 explained in the third embodiment, and the like can be disposed on the sides of the laser medium 5.

As explained above, according to the fourth embodiment, the sides of the laser medium 5 are disposed in non-parallel to each other. Therefore, the parasitic oscillation in directions other than the optical axis 6 direction and the extraction of energy due to the amplification of the spontaneous emission light N decrease, and the decrease in the gain in the optical axis 6 direction is reduced. Therefore, the solid-state laser element 80 can output a high-power laser.

The substrate 11 (the substrate 11 including the reflection preventing film 15 and the roughened surface 16) explained with reference to FIGS. 6 to 8 in the first embodiment can be disposed in the solid-state laser elements 60 to 80 according to the second to fourth embodiments.

INDUSTRIAL APPLICABILITY

As explained above, the solid-state laser element according to the present invention is suitable for laser output performed by using the plane waveguide.

The invention claimed is:

1. A solid-state laser element of a plane waveguide type that causes a fundamental wave laser beam to oscillate in a beam axis direction in a laser medium of a flat shape and forms a waveguide structure in a thickness direction as a direction perpendicular to a principal plane of the flat shape in the laser medium, the solid-state laser element comprising:
   an end face perpendicular to the beam axis direction through which the fundamental wave laser beam is input to the laser medium in the beam axis direction; and
   inclined sections that are provided on both sides of the laser medium and inclined a same predetermined angle to reflect spontaneous emission light in the laser medium to pass through a principal plane side of the flat shape that is parallel to the beam axis direction, the spontaneous emission light traveling in a principal plane width direction as a direction perpendicular to the beam axis direction and the thickness direction.

2. The solid-state laser element according to claim 1, wherein the inclined sections are mirror surfaces that reflect the spontaneous emission light.

3. The solid-state laser element according to claim 1, wherein the inclined sections are roughened surfaces that diffuse and transmit a part of spontaneous emission light and diffuse and reflect a part of the spontaneous emission light.

4. The solid-state laser element according to claim 1, further comprising a substrate that is disposed on a reflecting direction side of the spontaneous emission light by the inclined sections and bonded to the principal plane of the laser medium via a predetermined bonding surface, wherein an opposed surface of the substrate opposed to the bonding surface is a transmissive surface that transmits the spontaneous emission light from the inclined sections.

5. The solid-state laser element according to claim 1, further comprising a substrate that is disposed on a reflecting direction side of the spontaneous emission light by the inclined sections and bonded to the principal plane of the laser medium via a predetermined bonding surface, wherein the substrate includes a roughened surface.

6. The solid-state laser element according to claim 1, wherein surfaces formed by the inclined sections that reflect the spontaneous emission light to a principal plane side of the flat shape are parallel to the beam axis direction of the fundamental wave laser beam that is input to the laser medium through the end face.

7. The solid-state laser element according to claim 1, wherein the principal plane side of the flat shape has a larger surface area than any other side of the flat shape.

8. The solid-state laser element according to claim 5, wherein the roughened surface is an opposition surface opposite to the bonding surface.

* * * * *